US009545764B2

(12) United States Patent
Allore et al.

(10) Patent No.: US 9,545,764 B2
(45) Date of Patent: Jan. 17, 2017

(54) ELECTRONIC DEVICE HAVING A DISPLAY AND METHOD FOR MANUFACTURE

(71) Applicant: Google Technology Holdings LLC, Mountain View, CA (US)

(72) Inventors: Joseph L Allore, Mundelein, IL (US); Michael J. Formenti, Channahon, IL (US); Michael J. Lombardi, Lake Zurich, IL (US); Michael L Neau, Kenosha, WI (US)

(73) Assignee: Google Technology Holdings LLC, Mountain View, CA (US)

( * ) Notice: Subject to any disclaimer, the term of this patent is extended or adjusted under 35 U.S.C. 154(b) by 147 days.

(21) Appl. No.: 14/136,470

(22) Filed: Dec. 20, 2013

(65) Prior Publication Data
US 2014/0240856 A1   Aug. 28, 2014

Related U.S. Application Data

(60) Provisional application No. 61/769,133, filed on Feb. 25, 2013, provisional application No. 61/769,129, (Continued)

(51) Int. Cl.
*G02B 7/02* (2006.01)
*B29D 11/00* (2006.01)
(Continued)

(52) U.S. Cl.
CPC ... *B29D 11/00009* (2013.01); *B29C 45/14311* (2013.01); *B29C 45/14336* (2013.01);
(Continued)

(58) Field of Classification Search
CPC .......... G02B 7/021; G02B 7/02; G02B 7/025; B29D 11/00009
(Continued)

(56) References Cited

U.S. PATENT DOCUMENTS 8,218,306 B2   7/2012   Lynch et al.
8,388,385 B2   3/2013   Jol et al.
(Continued)

FOREIGN PATENT DOCUMENTS

CN   102006739 A   4/2011
CN   102421597 A   4/2012
(Continued)

OTHER PUBLICATIONS

International Search Report and Written Opinion for PCT Patent Application No. PCT/US2014/018162, mailed on May 23, 2014, 9 pages.
(Continued)

*Primary Examiner* — James Greece
(74) *Attorney, Agent, or Firm* — Brake Hughes Bellermann LLP

(57) ABSTRACT

A method of making a device housing involves providing a transparent lens with a front surface and a rear surface, and a stepped flange along at least a portion of the lens perimeter. The method includes injecting plastic onto the transparent lens perimeter, including the stepped flange, the plastic forming a plastic feature that has a front surface that is tangent to the front surface of the transparent lens, a rear surface that is tangent to the rear surface of the transparent lens, and that extends outward from the sides of the transparent lens away from a device width center line. The plastic feature is molded to the rear surface of the transparent lens at at least one of two ends of the device housing, and the plastic encapsulates a stepped middle surface of the transparent lens flange. A device housing that is made by this method is also included.

9 Claims, 17 Drawing Sheets

Related U.S. Application Data filed on Feb. 25, 2013, provisional application No. 61/769,131, filed on Feb. 25, 2013, provisional application No. 61/769,135, filed on Feb. 25, 2013.

(51) Int. Cl.

| | | |
|---|---|---|
| *G06F 1/16* | (2006.01) | |
| *H05K 5/00* | (2006.01) | |
| *B29C 45/14* | (2006.01) | |
| *H04M 1/02* | (2006.01) | |
| *G02F 1/1333* | (2006.01) | |
| *B29L 11/00* | (2006.01) | |
| *B29L 31/34* | (2006.01) | |
| *H04M 1/03* | (2006.01) | |
| *H04M 1/18* | (2006.01) | |
| *B29K 709/08* | (2006.01) | |

(52) U.S. Cl.
CPC ........ *B29C 45/14778* (2013.01); *G02B 7/025* (2013.01); *G06F 1/1601* (2013.01); *G06F 1/169* (2013.01); *G06F 1/1626* (2013.01); *G06F 1/1637* (2013.01); *H04M 1/0252* (2013.01); *H04M 1/0266* (2013.01); *H05K 5/0017* (2013.01); *B29C 45/14434* (2013.01); *B29C 2045/14327* (2013.01); *B29K 2709/08* (2013.01); *B29K 2995/0026* (2013.01); *B29K 2995/0037* (2013.01); *B29L 2011/0016* (2013.01); *B29L 2031/3475* (2013.01); *B29L 2031/3481* (2013.01); *G02F 1/133308* (2013.01); *G02F 2202/28* (2013.01); *G06F 2200/1612* (2013.01); *H04M 1/03* (2013.01); *H04M 1/185* (2013.01)

(58) Field of Classification Search
USPC .................................................. 359/811, 819
See application file for complete search history.

(56) References Cited

U.S. PATENT DOCUMENTS

| | | |
|---|---|---|
| 2010/0285260 A1 | 11/2010 | Bookbinder et al. |
| 2011/0048627 A1 | 3/2011 | Chang et al. |
| 2011/0050053 A1 | 3/2011 | Deng |
| 2011/0111176 A1* | 5/2011 | Chiu et al. ............... 428/157 |
| 2012/0044590 A1 | 2/2012 | Alcazar |
| 2012/0118628 A1 | 5/2012 | Pakula et al. |

FOREIGN PATENT DOCUMENTS

| | | |
|---|---|---|
| EP | 0997262 A1 | 5/2000 |
| WO | 2011096958 A1 | 8/2011 |

OTHER PUBLICATIONS

International Preliminary Report on Patentability for PCT Patent Application No. PCT/US2014/018162, mailed on Sep. 3, 2015, 7 pages.

Office Action for CN Application No. 201480010334.5, mailed Aug. 5, 2016, 18 Pages.

\* cited by examiner

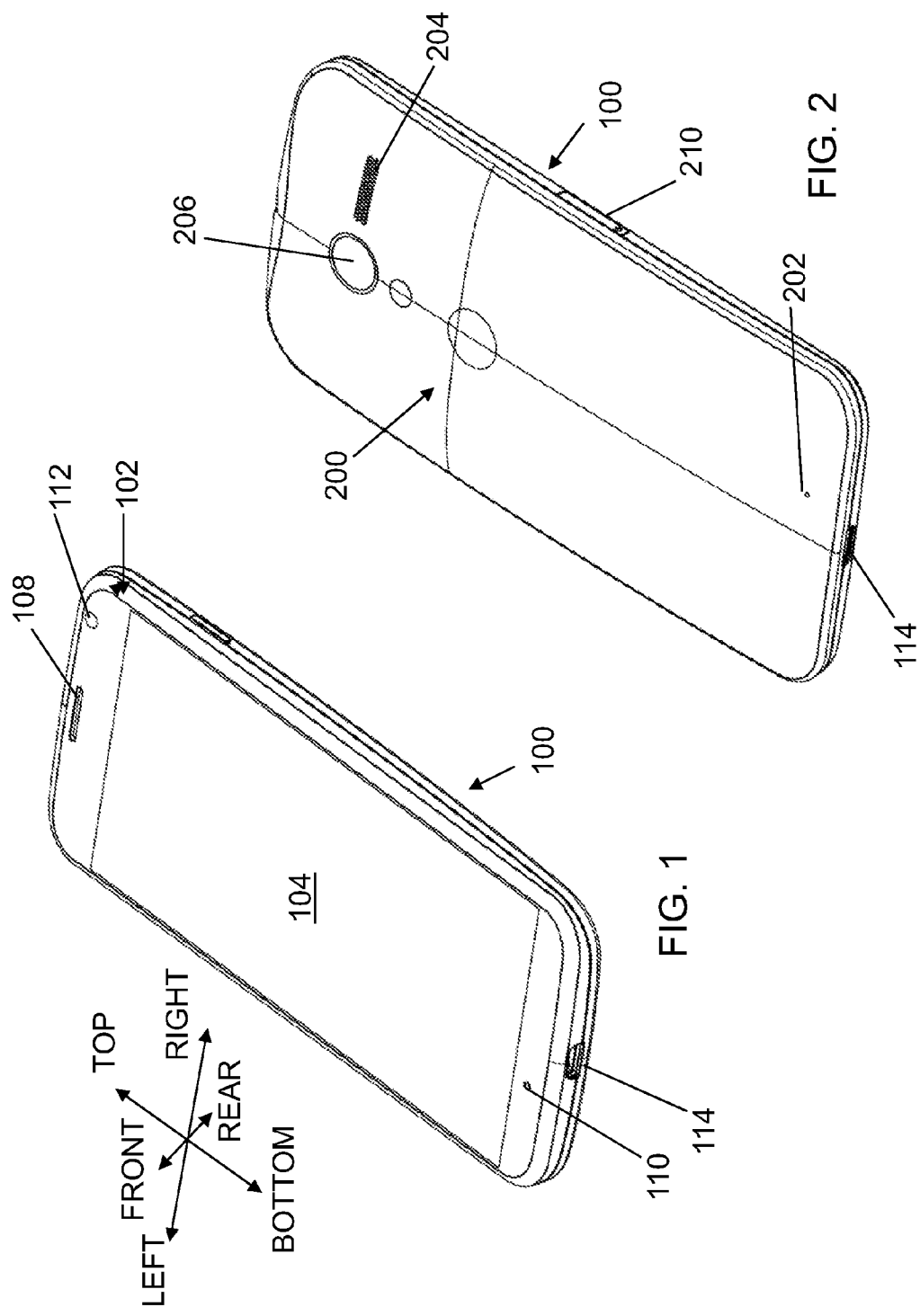

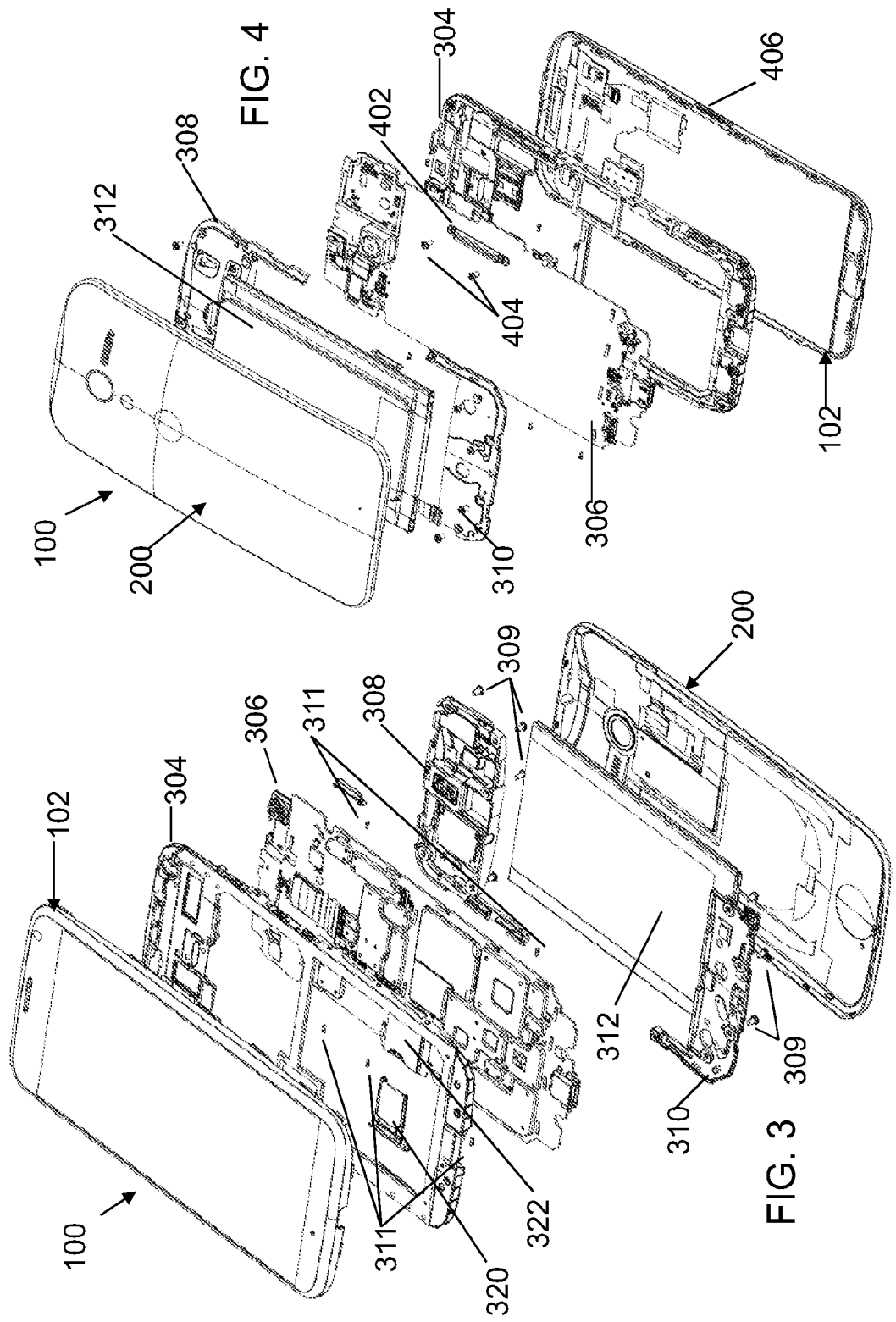

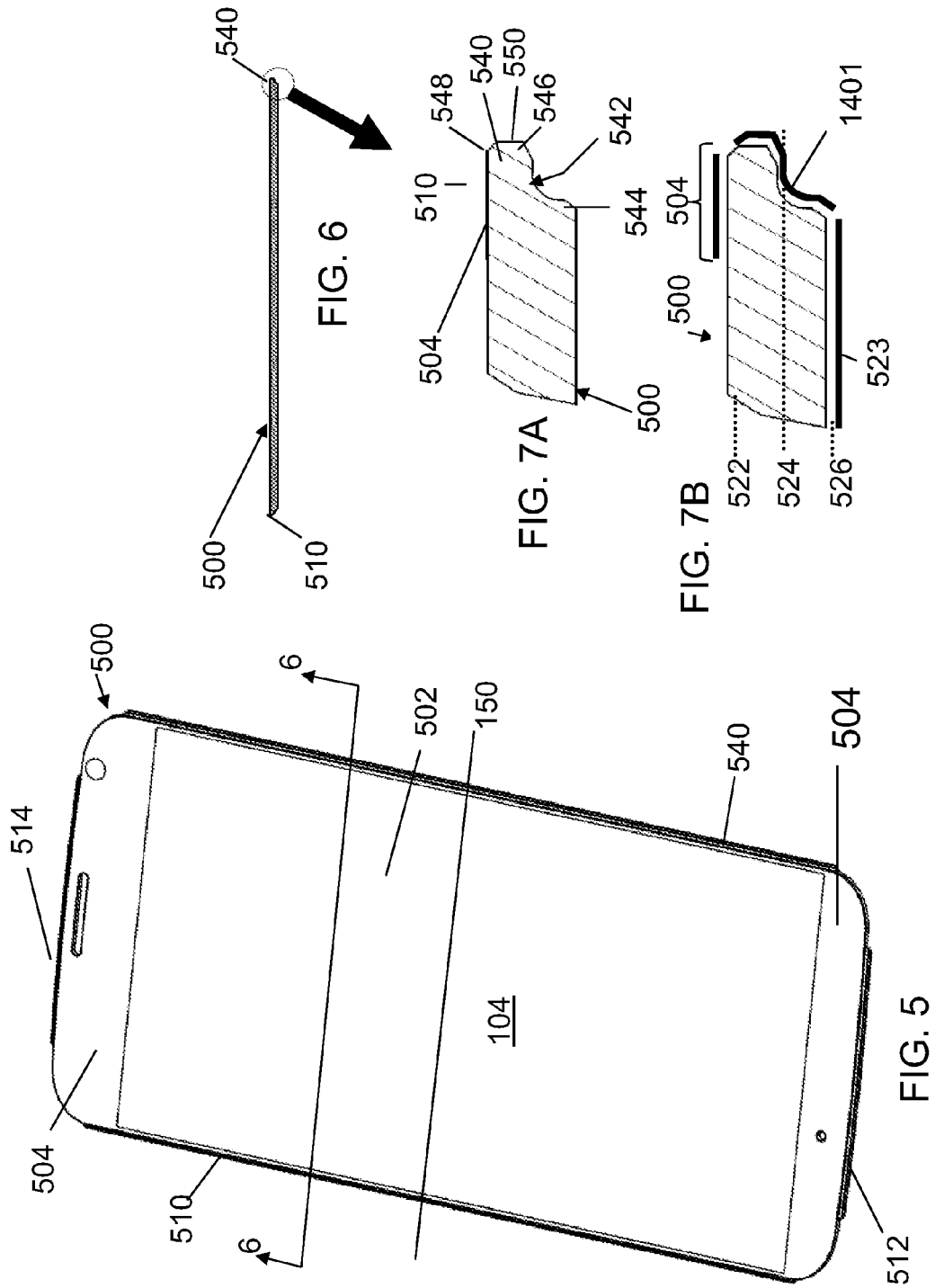

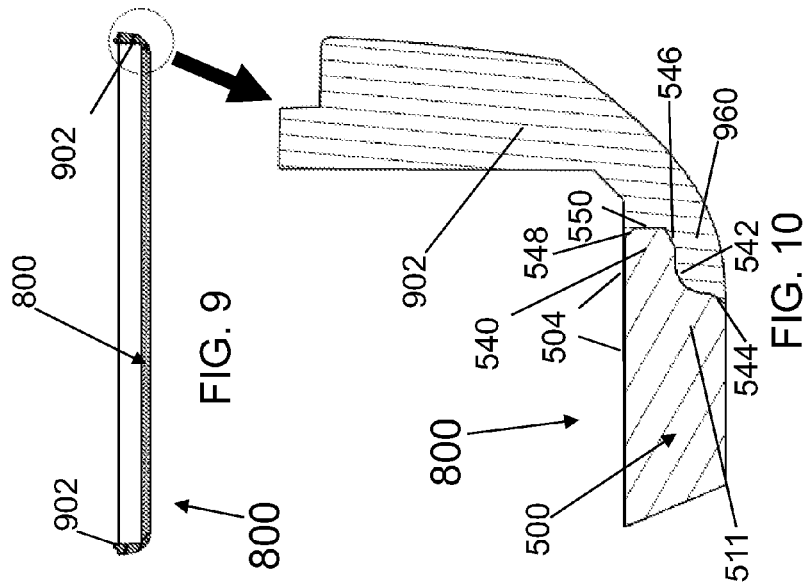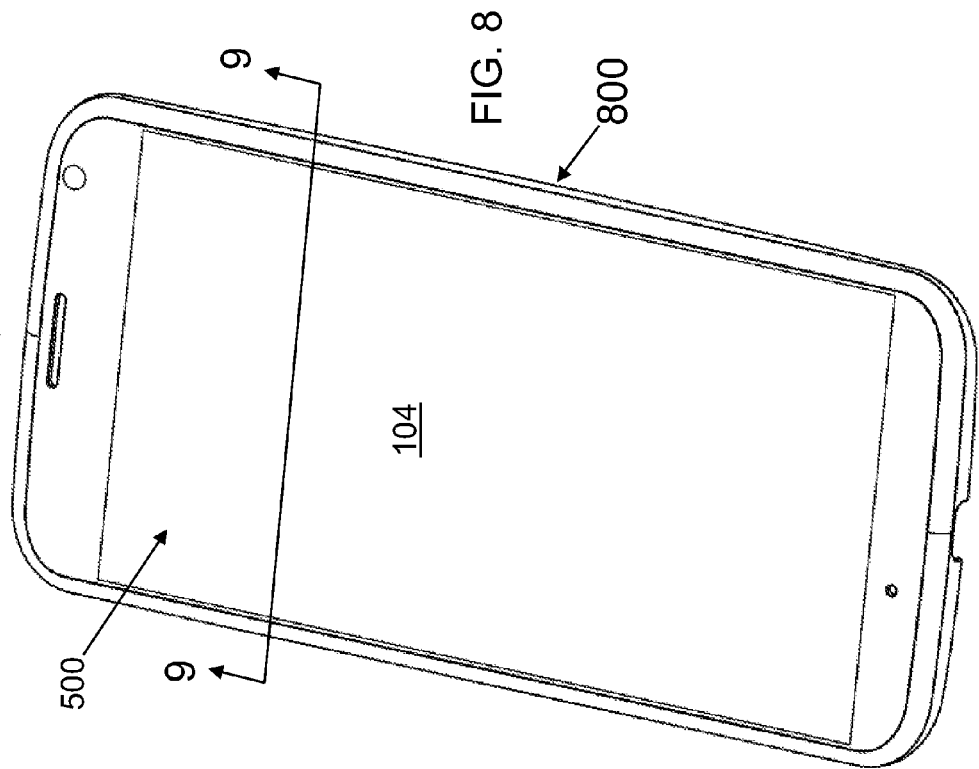

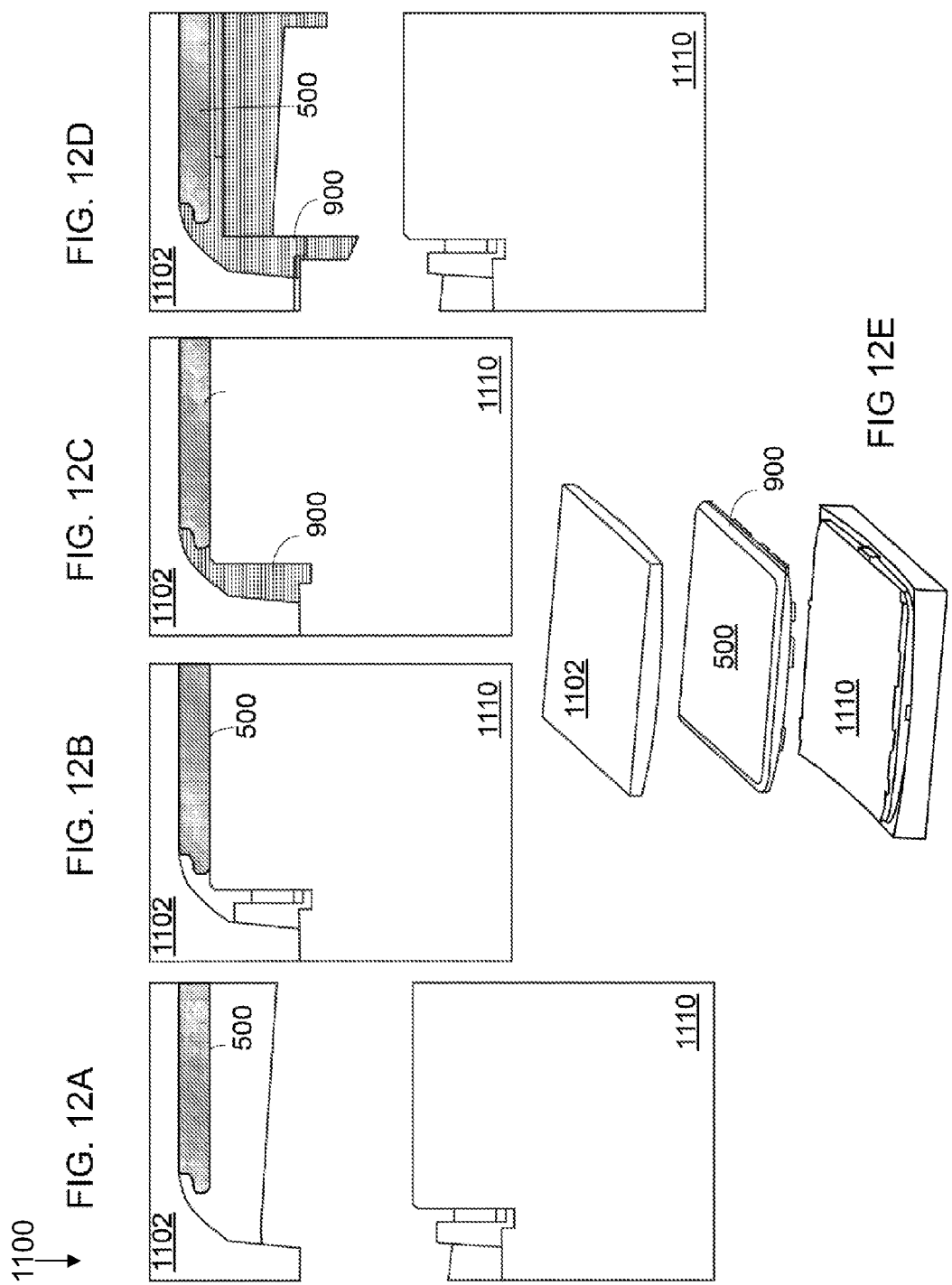

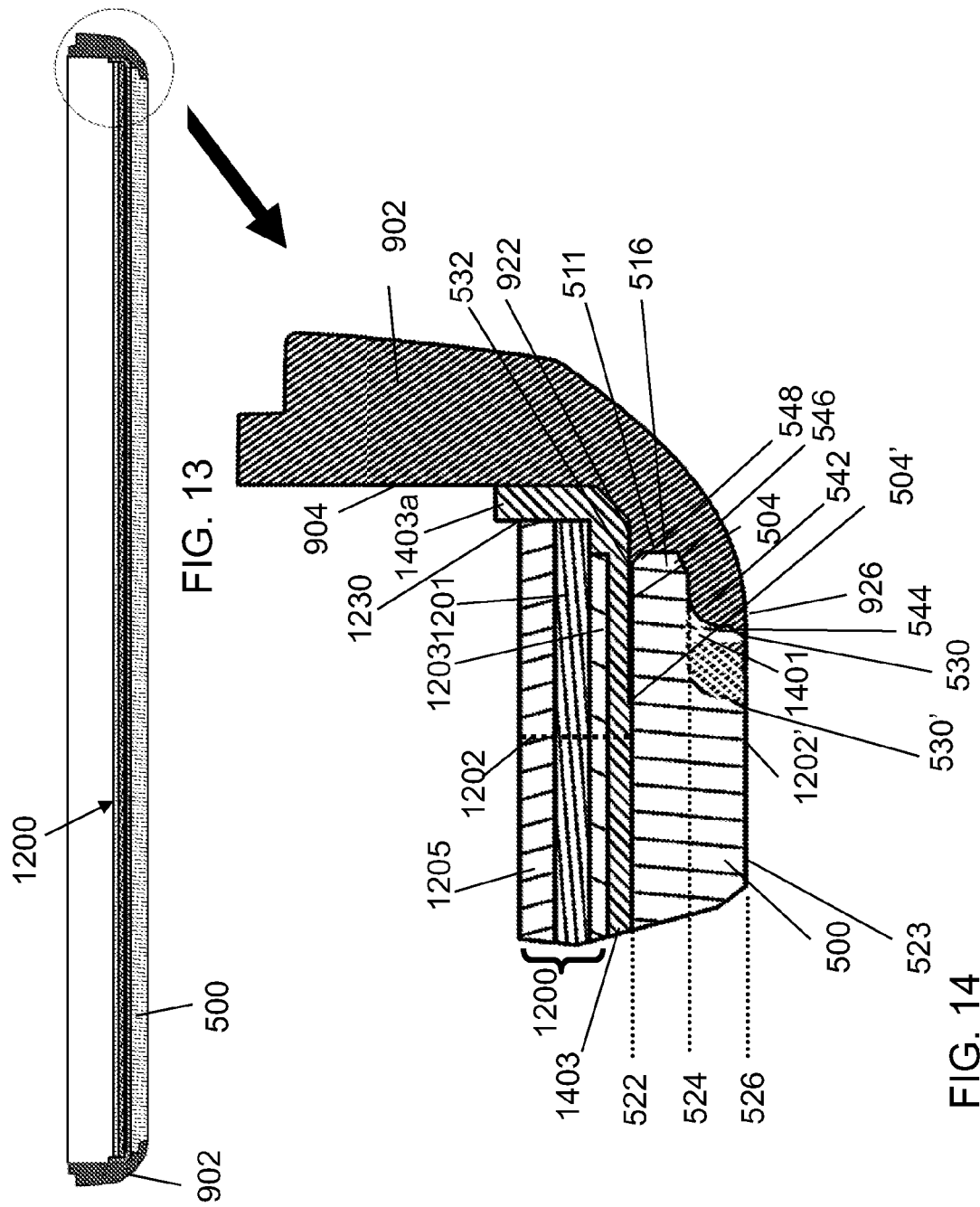

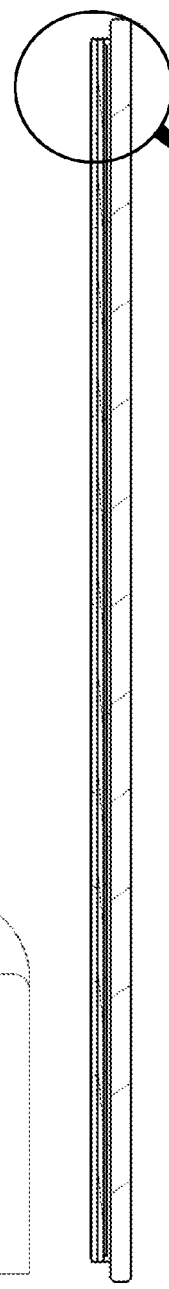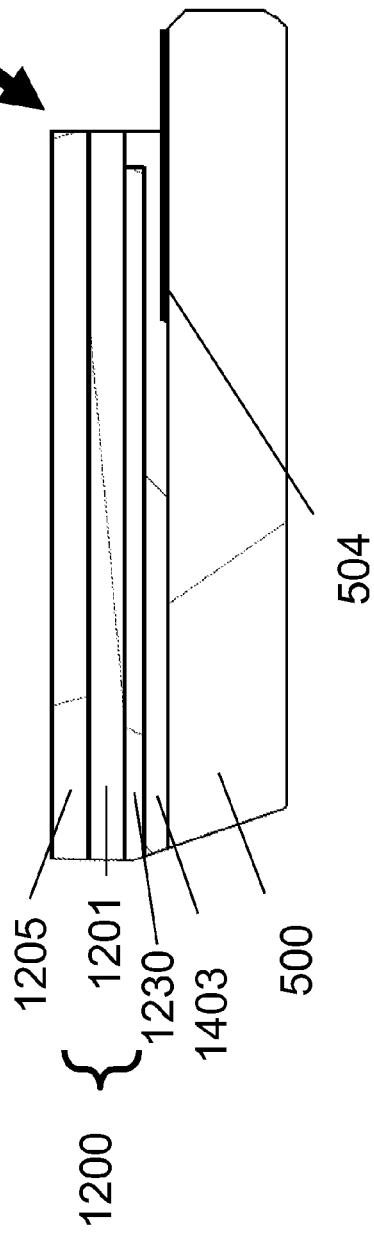

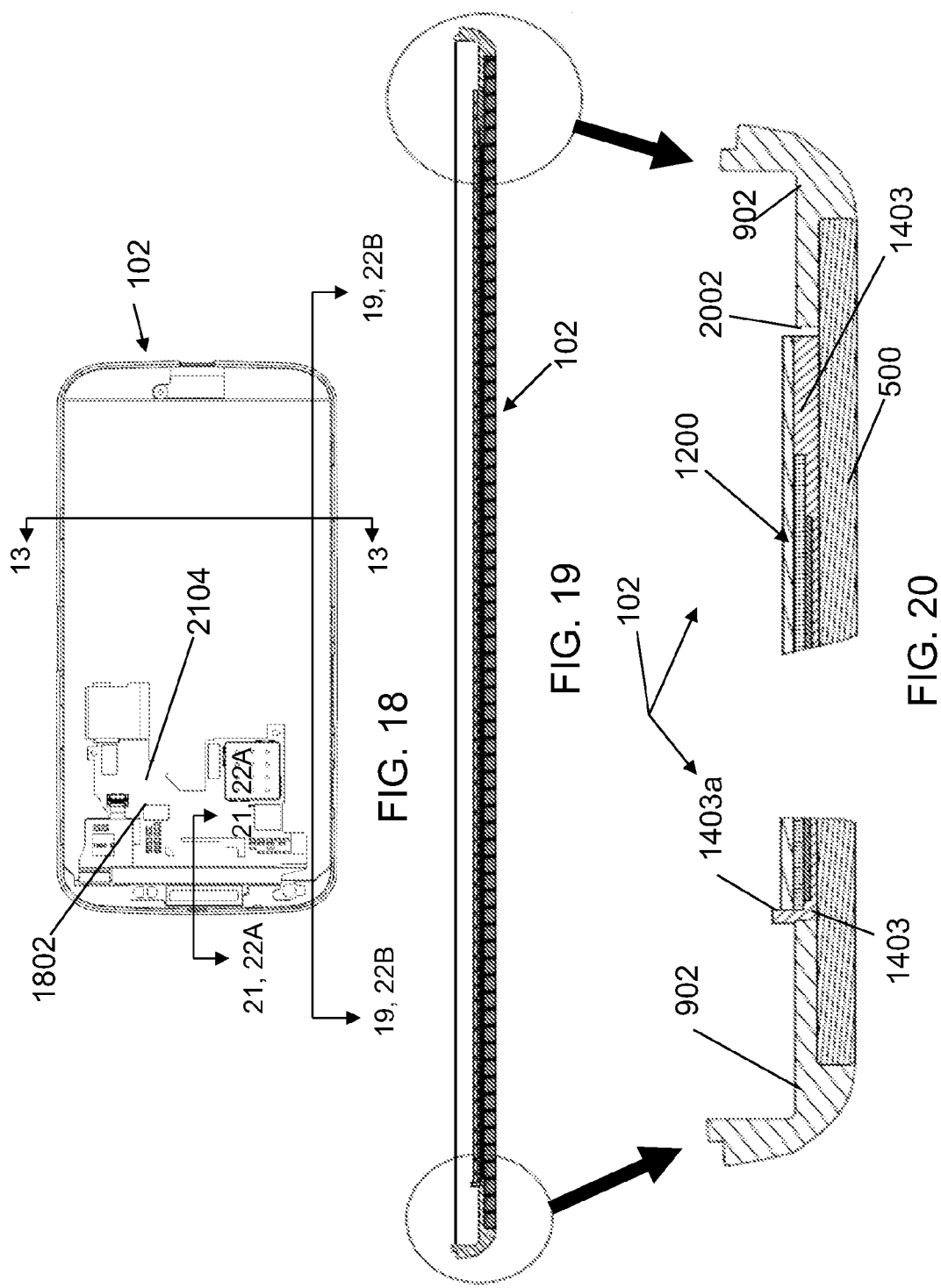

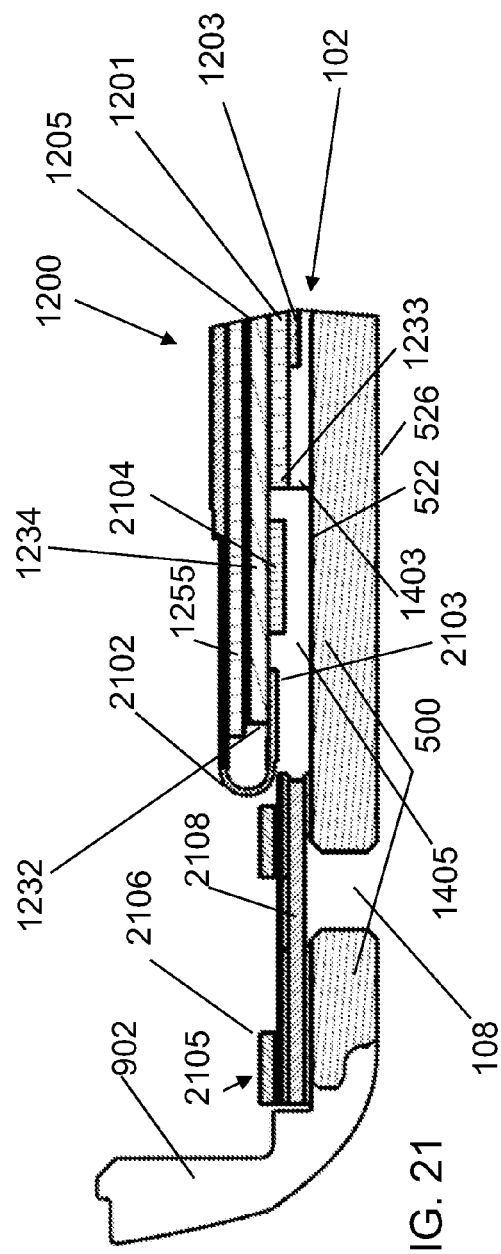
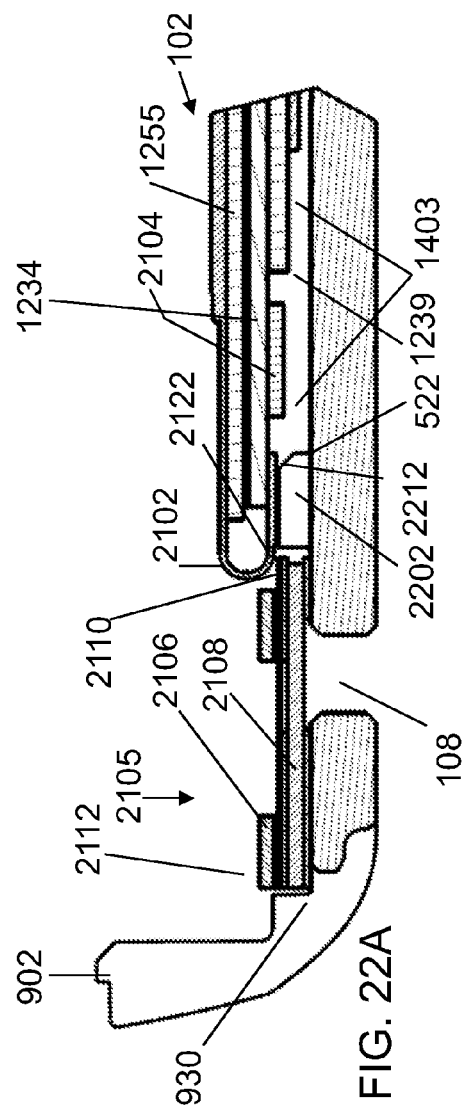

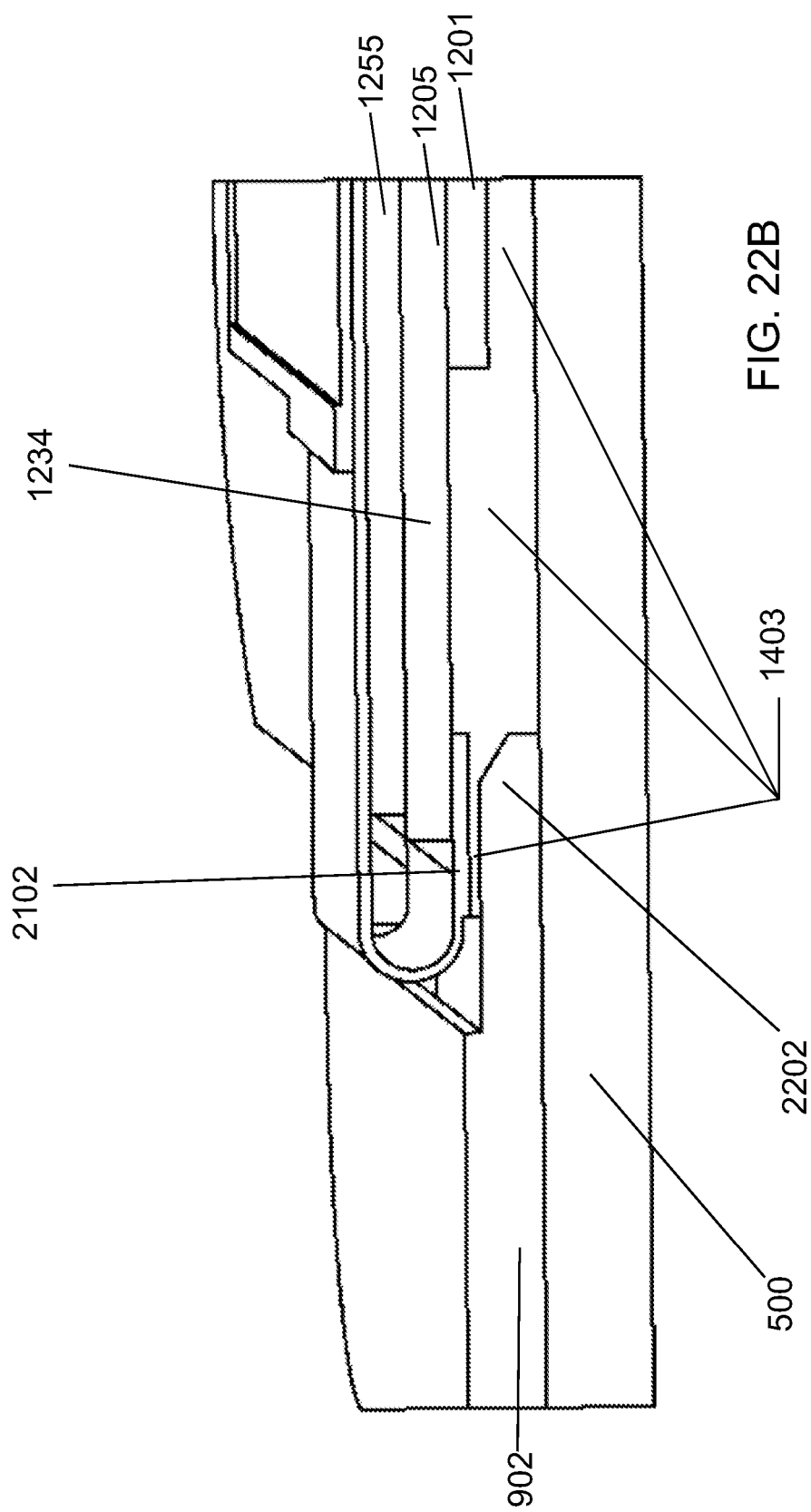

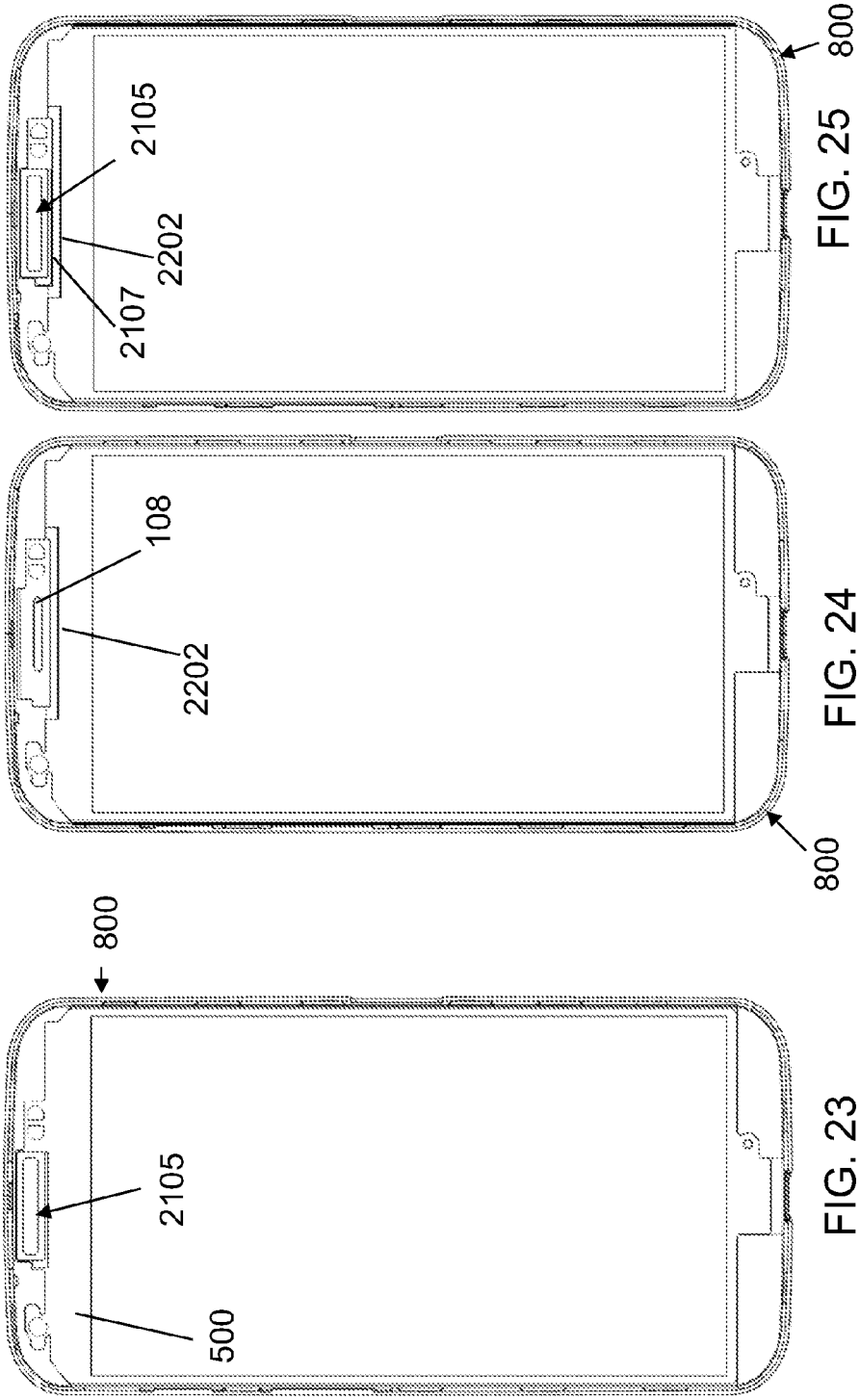

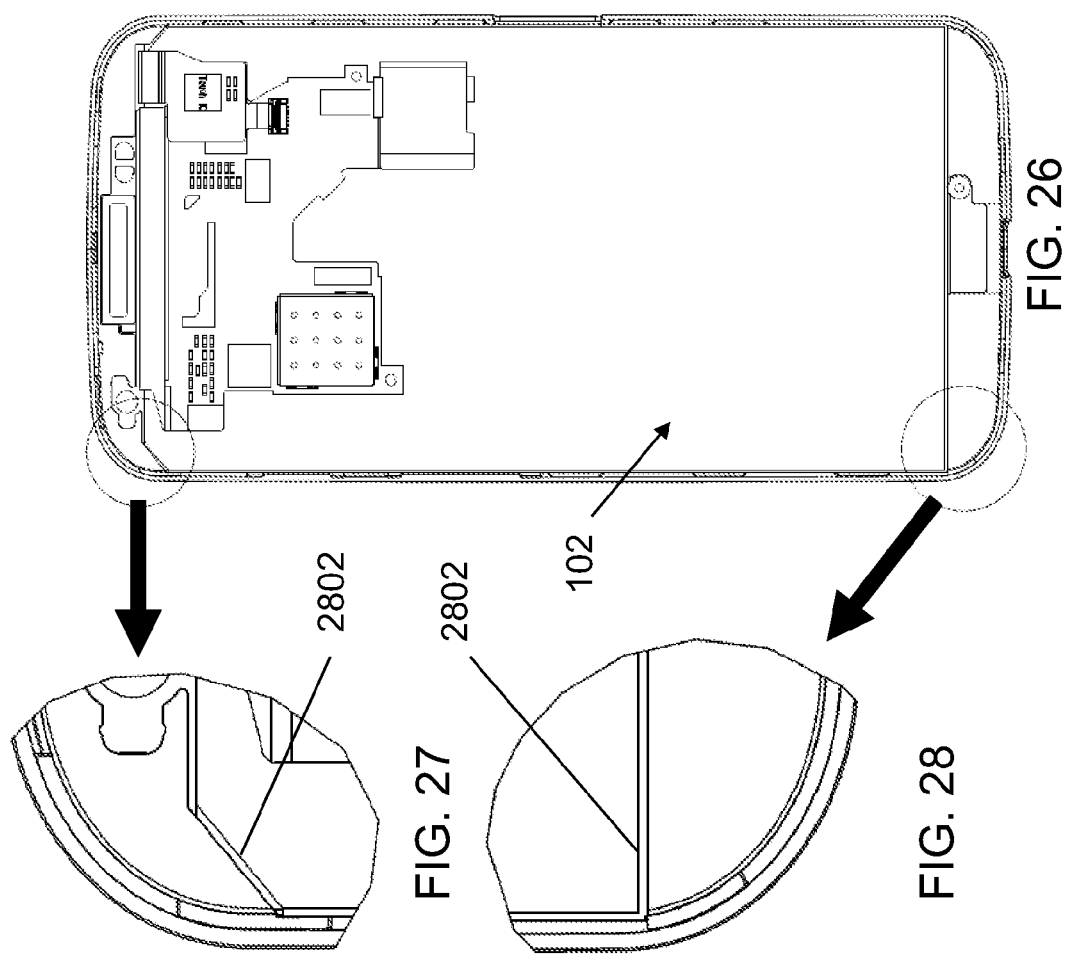

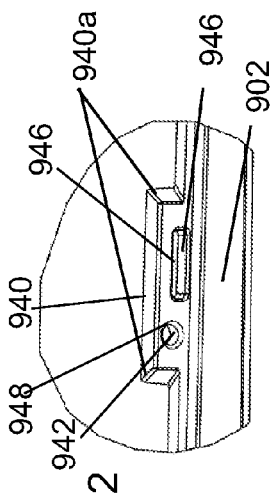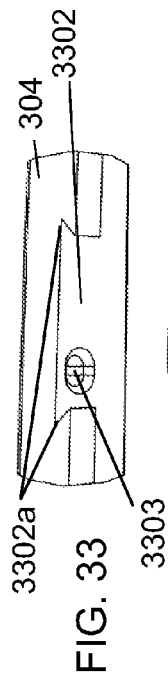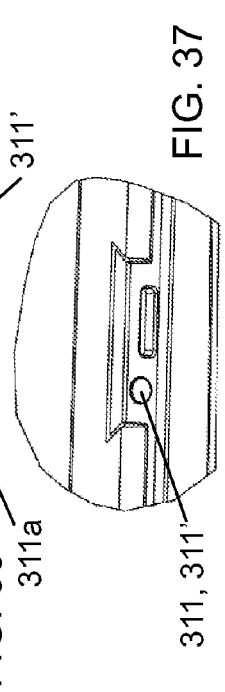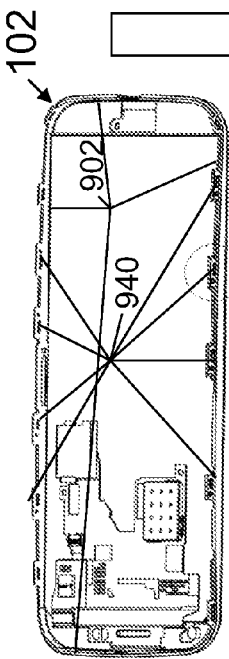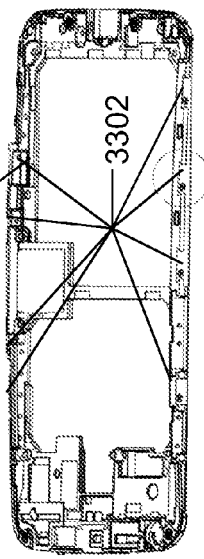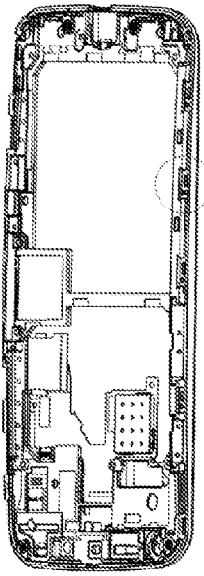

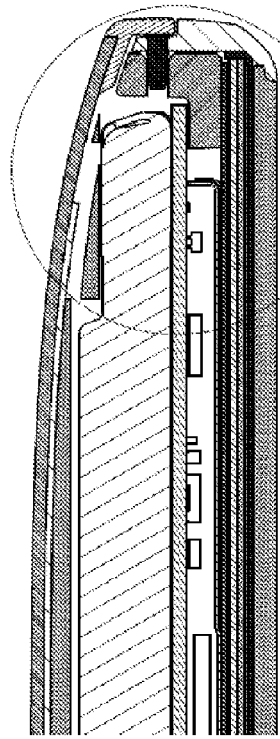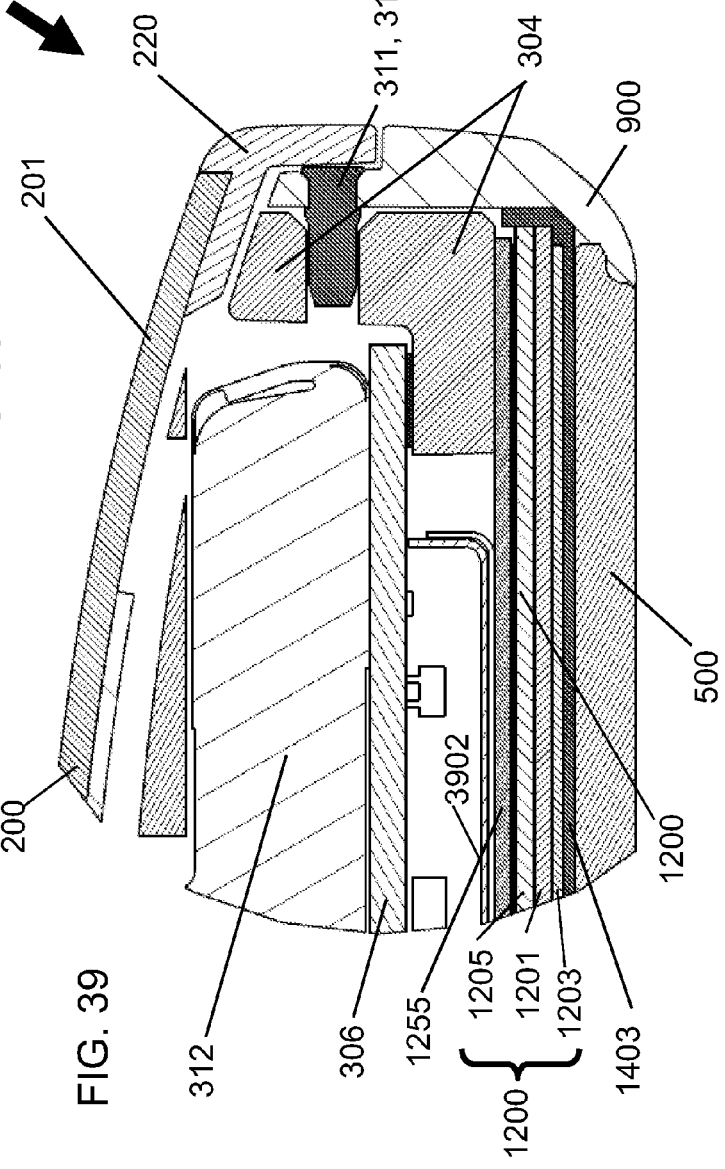
FIG. 38
FIG. 39

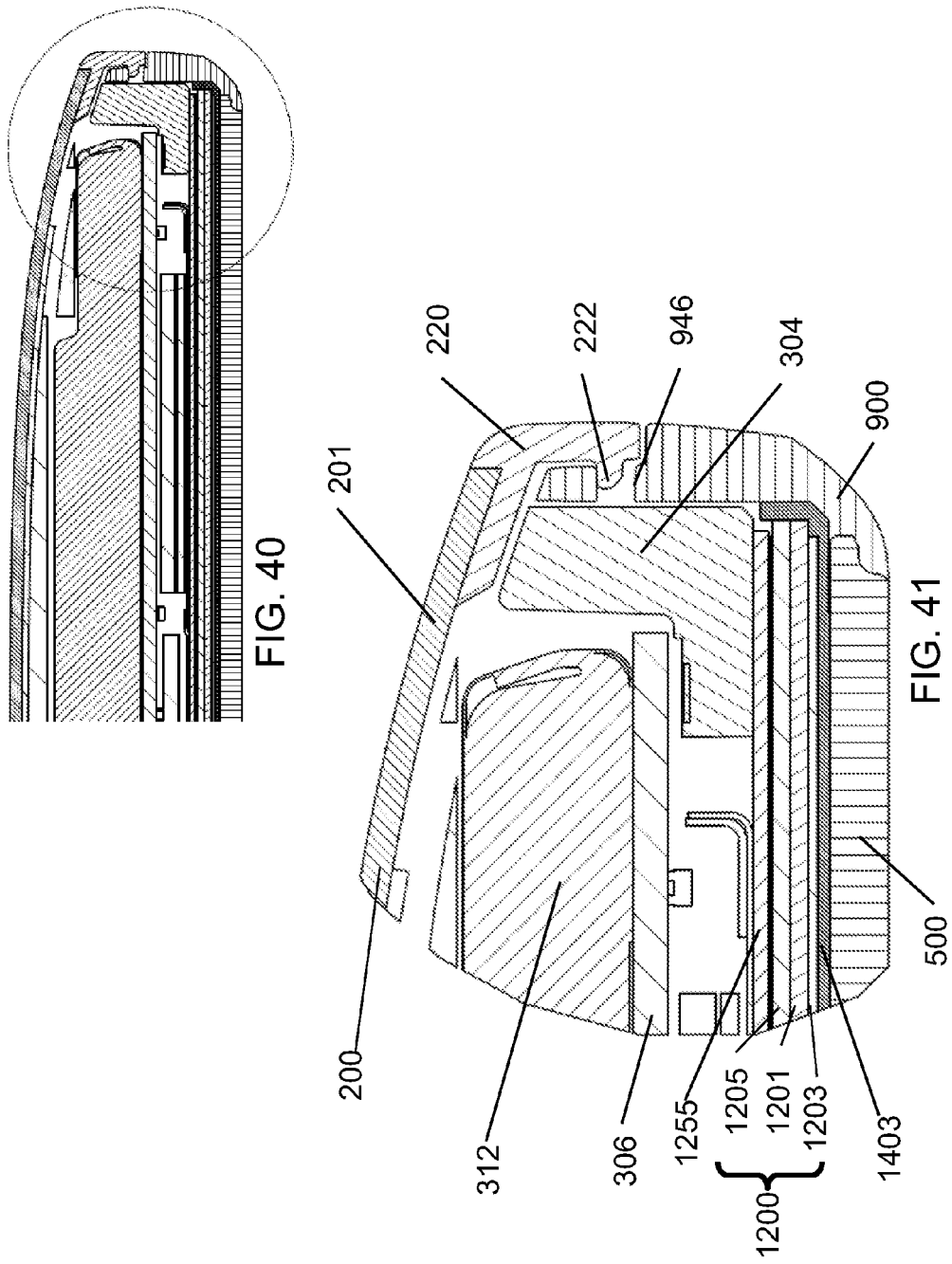

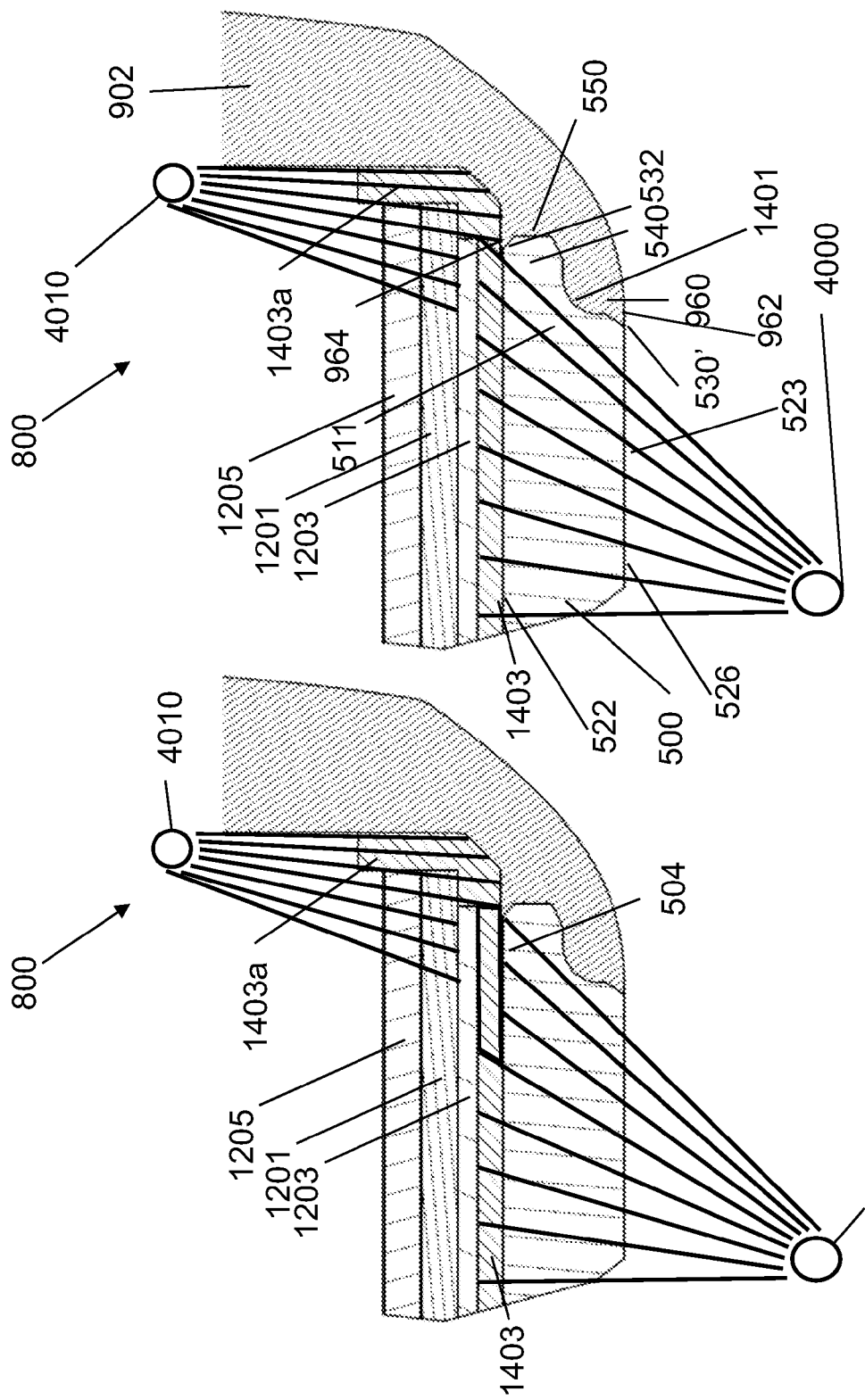

ELECTRONIC DEVICE HAVING A DISPLAY AND METHOD FOR MANUFACTURE

CROSS REFERENCE TO RELATED APPLICATIONS

The present application claims the benefit of U.S. Provisional Application No. 61/769,133, filed Feb. 25, 2013, U.S. Provisional Application No. 61/769,129, filed Feb. 25, 2013, U.S. Provisional Application No. 61/769,131, filed Feb. 25, 2013, and U.S. Provisional Application No. 61/769,135, filed Feb. 25, 2013, all herein incorporated by reference.

BACKGROUND

It is becoming increasingly difficult to manufacture portable electronic devices including a battery and a display that are relatively compact, structurally robust, and take advantage of the largest available viewing area.

In portable electronic devices, displays are frequently laminated to transparent cover lenses to improve optical performance and create a mechanical bond between the two parts. Since this bond is present over the entire viewing area of the display, it provides enough mechanical retention to eliminate the need for retaining the sides of the display by any other mechanisms. Thus, on either side of the display, one simply needs to have a thin cosmetic housing to cover the side of the display. However, in attempting to use a minimally thin cosmetic housing to cover the edge of the display, one encounters the problem of finding an appropriate connection mechanism between this cosmetic housing and other housings in the portable device that would not itself increase the device's size.

Further complicating the search for a viable connection mechanism is the desire for reduced device thickness to improve user comfort when the device is in use or being transported.

With regard to methods of making a transparent lens and plastic housing for a device, traditionally, the process of insert molding includes placing a stiff metal insert into an injection molding tool and then molding plastic features around the metal part. When complete, the plastic should be well integrated in the original metal part. Recently, advancements have been made in mold quality permitting pieces of glass or different transparent material to be used as the "insert" such that complex three-dimensional plastic geometry may be integrated with a sheet of transparent material.

In a portable device, it is desirable for the transparent cover lens over the display to be integrated with overmolded plastic features, but this disadvantageously creates limitations as to the potential geometry for the glass or transparent insert. Over the viewing area of the display, one desires the transparent cover lens to be substantially thin and flat to result in an undistorted image and a small size for the finished device. Additionally, one desires that this cover lens also be as narrow and short as possible so that the resulting device is a minimal size. Conversely, the glass or transparent insert mold process prefers a large amount of material beyond the display to improve the bond between plastic and glass or different transparent material and ensure that the overmolded plastic does not detach from the transparent insert in the finished product.

With regard to supporting transparent, and particularly glass, elements in a display device, portable electronic devices are exposed to frequent mechanical shocks over their lifespan, which can lead to display failures. Such displays are often laminated to a thick transparent cover lens, but the displays themselves are typically constructed using multiple sheets of thin glass, leaving them susceptible to breakage—especially at the edges of the glass sheets. Additionally, these thin sheets of glass often do not have matching widths or lengths as compared to other elements or housings, which may create a "ledge" of unsupported glass. The unsupported thin glass ledge acts as a cantilever if the device experiences mechanical shock, and is a potential source of display failures.

BRIEF DESCRIPTION OF THE DRAWINGS

The accompanying Figures, where like reference numerals refer to identical or functionally similar elements throughout the separate views, together with the detailed description below, serve to further illustrate embodiments set forth in this disclosure.

FIG. 1 is a front perspective view of an electronic device;

FIG. 2 is a rear perspective view of the electronic device according to FIG. 1;

FIG. 3 is a front perspective exploded view of the electronic device according to FIG. 1;

FIG. 4 is a rear exploded perspective view of the electronic device according to FIG. 1;

FIG. 5 is a front perspective view of a lens that may be used in the device according to FIG. 1;

FIG. 6 is a bottom end cross-sectional view illustrating a slice of the lens taken along the plane 6-6 in FIG. 5;

FIG. 7A is an enlarged side view illustrating a cross sectional view of the lens edge flange according to FIG. 6;

FIG. 7B is an enlarged side view illustrating a cross sectional view of the lens edge flange according to FIG. 6 with ink, adhesive, and oleophobic coating;

FIG. 8 is a front perspective view of a lens housing including the lens according to FIGS. 5-7 for the front of the electronic device according to FIG. 1;

FIG. 9 is a cross-sectional bottom end view illustrating a slice of the lens housing taken along plane 9-9 of FIG. 8;

FIG. 10 is an enlarged view illustrating a cross sectional view of the lens housing including the edge flange according to FIG. 9;

FIGS. 12A-D are cross sectional views of injection molding process steps;

FIG. 12E is an exploded view of the injection molding tool;

FIG. 13 is a cross-sectional view illustrating a slice of the lens housing and display laminate taken along plane 13-13 of FIG. 18;

FIG. 14 is an enlarged view of a section of the lens housing and display laminate according to various embodiments of FIG. 13;

FIG. 15 is an enlarged side cross sectional view illustrating a prior art cross section of lens housing including a transparent lens and molded wall;

FIG. 16 is a side cross sectional view of a lens and display laminate according to the prior art;

FIG. 17 is an enlarged side cross sectional view of a lens and display laminate according to the prior art;

FIG. 18 is a rear orthogonal view illustrating the lens housing and display laminate including a display with integrated touch screen sensor according to FIG. 11;

FIG. 19 is a side cross-sectional view illustrating a slice of the lens housing and display laminate taken along line 19-19 of FIG. 18;

FIG. 20 is an enlarged illustration of two sections of the lens housing and display laminate according to FIG. 19;

FIG. 21 is an enlarged side cross sectional view illustrating an end of a lens housing according to one embodiment;

FIG. 22A is an enlarged side cross sectional view illustrating an end of a lens housing according to an alternate embodiment;

FIG. 22B is a perspective cross sectional view illustrating an end of a lens housing;

FIG. 23 is a rear orthogonal view illustrating the lens housing without a support structure, but with a mesh and gasket assembly;

FIG. 24 is a rear orthogonal view illustrating the lens housing with a support structure, but without a mesh and gasket assembly;

FIG. 25 is a rear orthogonal view illustrating the lens housing with a mesh and gasket assembly inserted;

FIG. 26 is a rear orthogonal view illustrating the lens housing and display laminate;

FIG. 27 is an enlarged rear view illustration of a top section of the lens housing and display laminate according to FIG. 26;

FIG. 28 is an enlarged rear view illustration of a bottom section of the lens housing and display laminate according to FIG. 26;

FIGS. 29-31 are right side perspective view diagrams illustrating assembly of the device according to FIG. 1;

FIG. 32 is a right side perspective view of a dovetail protrusion on the plastic side wall;

FIG. 33 is a right side perspective view of a dovetail cut in the internal chassis assembly;

FIG. 34 is a right side perspective view of the dovetail protrusion being placed, in an assembly step, into the dovetail cut to assemble the plastic side wall with the internal chassis assembly;

FIG. 35 is a side view of an exemplary pin having a retaining feature on its shaft;

FIG. 36 is a side view of an exemplary pin without a retaining feature on its shaft;

FIG. 37 is a right side perspective view of the assembled the plastic side wall and internal chassis assembly with the pin inserted;

FIG. 38 is a bottom cross sectional view of a section of the device according to FIG. 1;

FIG. 39 is an enlarged bottom cross sectional view of a section of the device according to FIG. 38;

FIG. 40 is another bottom cross sectional view of a section of the device according to FIG. 1 showing a retaining finger;

FIG. 41 is an enlarged bottom cross sectional view of a section of the device according to FIG. 40;

FIG. 42 illustrates one embodiment of UV curing of the optically clear adhesive during the assembly of the laminated display and lens housing with an opaque ink mask present; and FIG. 43 is another embodiment of UV curing of the optically clear adhesive during the assembly of the laminated display and lens housing without an ink mask.

Figure 11:
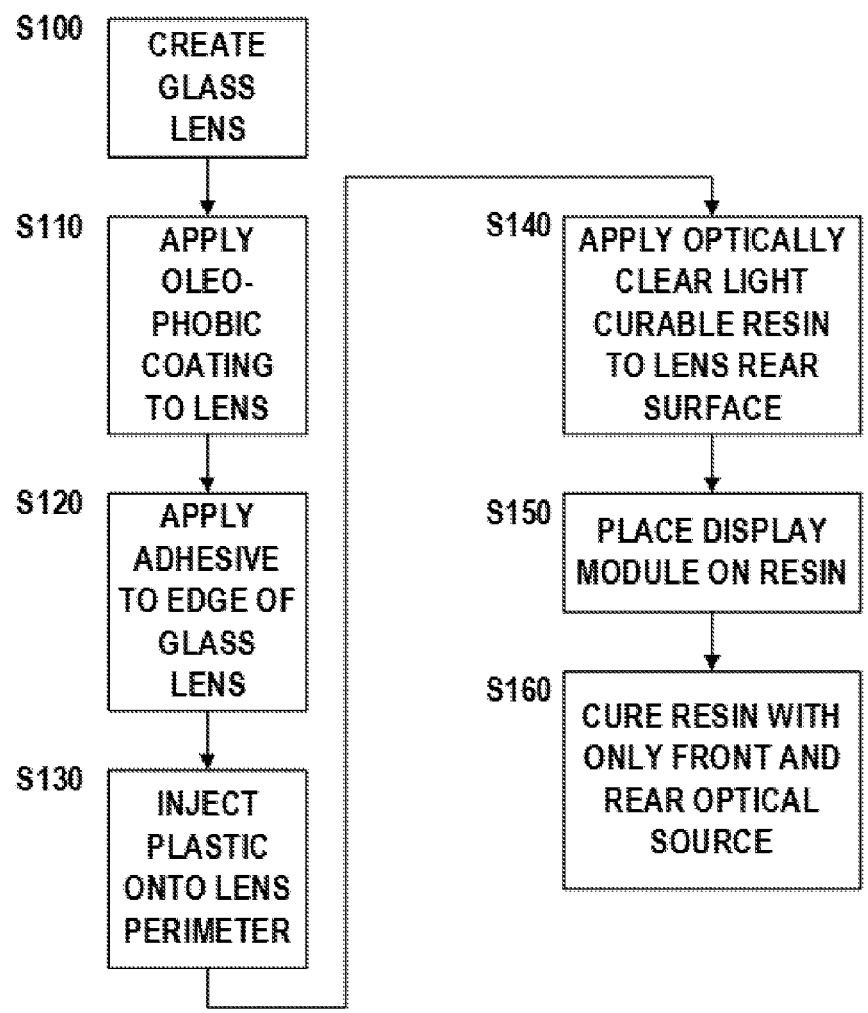
FIG. 11 is a flowchart illustrating an exemplary method of manufacture.

Skilled artisans will appreciate that elements in the Figures are illustrated for simplicity and clarity and have not necessarily been drawn to scale. For example, the dimensions of some of the elements in the Figures may be exaggerated relative to other elements to help to improve understanding of various embodiments disclosed herein.

The apparatus and method components have been represented where appropriate by conventional symbols in the drawings, showing the specific details that are pertinent to understanding the various embodiments and not obscuring the disclosure with details that will be readily apparent to those of ordinary skill in the art having the benefit of the description herein.

DETAILED DESCRIPTION

In the following description, for purposes of explanation, numerous specific details are set forth to provide a thorough understanding of the embodiments disclosed herein. However, it will be apparent to one skilled in the art that these embodiments can be practiced without these specific details. In some instances, structures and devices are shown in block diagram form for the sake of conciseness.

The embodiments described herein can minimize device thickness, since a screw head, when using screws, can increase the device width by the head thickness, and can enhance reliability over snaps, which can loosen over time, have limited directional constraints, and can disengage upon mechanical shock. They can allow excellent serviceability over heat stakes that also require clearance for heat stake heads and avoid the need for special equipment and design efforts. Finally, they also allow excellent serviceability over glue and do not require the special equipment or complex process control that glue requires. These embodiments have great mechanical reliability and allow creation of robust attachment features over 3D formed glass or other transparent material, and have higher mechanical strength and less likelihood of scratching over the viewing area of the display over clear plastic housings.

Using the process of insert-molding plastic over the transparent cover lens, plastic details can be integrated directly onto the transparent material. This allows the transparent cover lens to be sized smaller than the display, but use the plastic overmold to keep the display edges protected during manufacturing and in the finished device. By undersizing the cover lens and eliminating the need for a traditional device housing to display/cover lens assembly bond (replaced by the in-mold bond of plastic to glass or other type of transparent material), the process is capable of producing a smaller, more reliable portable device.

In an embodiment of the disclosure, a transparent lens and differing plastic material housing include a transparent lens including a front surface, a rear surface, and a perimeter edge, the perimeter edge including a flange, a plastic housing affixed to the perimeter edge flange having a different material than the transparent lens, a portion that is tangent to the front surface of the transparent lens, and a portion that is tangent to the rear surface of the transparent lens.

The transparent lens can be made of glass or can be made of a durable transparent plastic material that differs from the material of the side walls to which it is attached. As described herein, when the transparent lens is made of plastic, it is to be understood that this constitutes a different material than the plastic used in the side walls.

In an embodiment, a display housing assembly is provided. The display housing assembly has a transparent portion and a plastic portion, and includes a transparent lens having a front surface, rear surface, and perimeter edge. The perimeter edge includes a flange. A plastic side wall of the plastic portion is affixed to the flange. The plastic sidewall has a front surface portion that is co-planar with the front surface of the transparent lens; and a rear surface portion that is co-planar with the rear surface of the transparent lens. This configuration forms front and rear planar surfaces, each of which has both transparent material and plastic. The assembly further including a display that is affixed to the rear planar surface using a display adhesive.

In an embodiment of the disclosure, a device housing assembly has a display module including a front pane that may be transparent and a rear pane that may be transparent, the rear pane having a section longer than the front pane in at least one direction. The housing assembly further has a transparent lens and plastic housing, the transparent lens having a front and rear surface; and an adhesive between the front pane and the rear surface of the transparent lens. The housing includes a support structure molded to the rear surface of the transparent lens positioned proximally to the longer section of the rear pane and adjacent to the front pane, the structure providing mechanical support for the rear pane.

Another embodiment of the disclosure is a thin cosmetic housing having dovetail features that assemble in a linear direction to an internal structural housing. The housing has cutouts to accept the dovetail features, thus constraining the cosmetic and structural housings in two axes.

In assembling the housing, once the dovetail features are aligned, a pin is inserted through a hole in each dovetail perpendicular to the direction of dovetail assembly and into a hole in the structural housing. These pins constrain the cosmetic and structural housings in the third and final axis. Finally, a second thin cosmetic housing is snapped into snap holes on each dovetail of the first cosmetic housing which engage in the direction of the third axis. This housing fully covers the pins inserted previously which results in a better appearance of the finished device and prevents the pins from backing out far enough to disengage should they loosen over time. The attachment system results in a reduced width and thickness of the finished device.

More specifically, the housing comprises a first housing component with a plurality of dovetail protrusions, at least one dovetail protrusion of the plurality having a first pin hole through a thickness of the protrusion, and a second housing component with a plurality of matching dovetail cuts, at least one dovetail cut containing a second pin hole. The housing further has a plurality of pins. The first housing component is mated in a linear direction with the second housing component with each dovetail protrusion aligned to each dovetail cut. The first housing component and second housing component are pressed together to align the first pin holes axially with the second pin holes, and the pins are inserted axially through each axially aligned first pinhole and second pin hole.

In an embodiment of the disclosure, a method of making a device housing involves providing a transparent lens with a front surface and a rear surface, and a stepped flange along at least a portion of the lens perimeter. The method includes injecting plastic onto the transparent lens perimeter, including the stepped flange, the plastic forming a plastic feature that has a front surface that is tangent to the front surface of the transparent lens, a rear surface that is planar with the rear surface of the transparent lens, and that extends outward from the sides of the transparent material away from a device width center line. The plastic feature is molded to the rear surface of the transparent lens at at least one of two ends of the device housing, and the plastic encapsulates a stepped middle surface of the transparent lens flange. A device housing that is made by this method is also included in an embodiment.

An electronic display device 100 including a display is illustrated in FIGS. 1 and 2. FIG. 1 includes a reference coordinate system that is referred to below, indicating left and right sides of the device 100 (from a user's perspective when holding the device), top and bottom sides (or ends) (the top being the side generally away from the ground during normal use, and the bottom being the side generally toward the ground during normal use), and front and rear sides (the front being the side facing a user during normal use, and the rear side being the side facing away from a user during normal use).

The electronic device 100 may be any portable electronic device including a display, and may for example be a cellular phone, a smart phone, an internet device, a music player, or any other device that includes a display that can advantageously employ the lens, display, laminated display assembly and/or housing assembly disclosed herein. Additionally, the mobile smartphone features of the communication device 100 illustrated herein are provided by way of example, and are in no way intended to be limiting, nor essential to the lens housing, display, or laminated display assembly, described and claimed herein.

The electronic display device 100 includes a lens housing with laminated display 102. The lens housing with laminated display 102 is advantageously manufactured as described in greater detail herein below. Speaker port 108 and a microphone port 110 openings allowing unobstructed access to a device speaker and microphone respectively are located at opposite ends of a display window 104 through which a user can view a display carried in the electronic device 100. The illustrated display device may include a forward facing camera 112 and an electrical connector port 114 for accessing circuitry within the housing. For example, the port 114 may accommodate a connector, such as a male connector, and may for example be of a commercially available connector, such as a universal serial bus (USB) connector, a mini USB, a micro USB, or other any other suitable connector.

The electronic display device 100 includes a rear housing 200 (FIG. 2). The rear housing 200 may include a rear microphone port 202, a rear speaker port 204 and a rear facing camera 206 similar to those found on the front of the device. Also illustrated in FIG. 2 is a removable card access door 210 for insertion and removal of electronic cards, such as a memory card, a subscriber identity module (SIM), or any other removable card that can be advantageously employed in the electronic device.

With reference now to FIGS. 3 and 4, the electronic display device 100 is illustrated with the housing components exploded, and more particularly is illustrated from each of the front and rear perspective views, respectively. The lens housing with laminated display 102 is manufactured as will be described in greater detail herein below. An internal chassis 304 is positioned behind the lens housing. The chassis may be manufactured from any suitable material, providing support for the housing, and may be metal, plastic or a suitable composite material, and may for example be stamped or die cast of any suitable metal, such as aluminum or a steel, or formed from a composite non-metal material, or molded plastic. The chassis 304 is advantageously a metal chassis having plastic overmolded sections in some areas of the chassis adjacent to which antennas will be positioned when the housing is fully assembled.

A printed circuit board (PCB) assembly 306 is positioned adjacent the chassis 304 when the device 100 is assembled. The PCB assembly 306 includes a circuit board on which electronic components are assembled, as is known in the art. The electronic components include circuitry necessary to the operation of the display device 100, as is well known in the art, which may also include circuitry for handling input of a touch screen component of the display (touch screen sensor). The PCB may be positioned completely within the chassis perimeter. The PCB may alternately be stacked onto the chassis 304 with electrical components attached to the PCB positioned inside the chassis. A top antenna housing 308 is attached to the chassis. The antenna housing 308 may be manufactured by any suitable means, and may for example be molded with platable resin to create a desired antenna geometry. A bottom antenna housing 310 is also attached to the chassis in the example device. The bottom antenna housing may also be advantageously molded with platable resin to create a desired antenna geometry. The top and bottom antenna housings 308, 310, clamp the PCB assembly 306 to the chassis 304 using suitable fasteners, such as screws 309, clips (not shown), or the like. In the illustrated example, screws 309 may be screwed into chassis 304 or the printed circuit board assembly 306.

The device 100 is also illustrated to include a card tray 320 for holding one or more of a memory and/or SIM card. The card tray 320 may for example be an insert molded plastic and metal tray for holding the SIM card. The card tray 320 slides into card bay 322. The card bay is assembled onto the PCB assembly 306.

The device 100 also includes a battery 312 behind the PCB assembly 306.

Pins 311 may be advantageously employed for assembling the electronic device, as will be described in greater detail herein below. The pins 311 may be manufactured from any suitable material, such as stainless steel, aluminum, another metal, plastic, or a composite material. The pins 311 are for insertion into the internal chassis 304 as will be described in greater detail herein.

The rear housing 200 may be manufactured from a composite material, such as an insert molded plastic, integrally bonded to a composite material, during a molding process. The composite material may be a sheet formed to the intended three dimensional shape of the rear housing, to provide a curved surface that is pleasant to hold, fitting comfortably in a hand when held. This shape may have a curvature in both the left-to-right side direction as well as a top-to-bottom end direction, where the curvature comprises the entire right-to-left direction and/or the entire top-to-bottom direction. Alternately, it may have a flat portion in one or both directions, where curved portions extend only near the edge regions.

With reference to FIG. 4, a card bay stiffener 402 is provided for the card access opening through which card tray 320 is inserted and retrieved from card bay 322. The card bay stiffener may for example be manufactured from metal, and secured using screws 404 affixed through each end of the stiffener 402. The screws 404 may be affixed to the chassis 304, the PCB 306, or the housing 102. The card access slot 406 is illustrated molded into the lens housing side wall for access to the card tray.

A transparent lens 500 (FIG. 5) includes a viewing window 104, which is a transparent region of the lens for alignment with the active pixels of the display. The perimeter of the window may be defined by an opaque ink 504, which is a layer applied to the back of the lens 500. The ink is not applied to the viewing window 104, circumscribing or extending along a portion of the window 104.

As can be seen in FIGS. 5-7B, a stepped flange 540 extends along the majority of the sides, top and bottom edge perimeter 510 of the lens. The flange 540, may be continuous around the entire perimeter 510 of the lens 500, or excluded in strategic areas to prevent damage to the lens if the device 100 is dropped or otherwise subjected to a shock. In FIG. 5, the example lens 500 does not include a flange 540 at the four corners of the lens, to help avoid breakage at these corners in the event the device is dropped at certain angles of impact.

FIG. 6 is a bottom end cross section view of the lens 500 along line 6-6 shown in FIG. 5, and showing the perimeter 510 and flange 540.

FIGS. 7A and 7B are zoomed regions of the cross-section view of FIG. 6. FIG. 7B is identical to that shown in FIG. 7A, but with the addition of an adhesive layer 1401 and oleophobic coating 523. In FIG. 7A, ink layer 504 can be seen along with detail of the flange 540. In an embodiment, the edge portion 510 comprises three chamfers 544, 546, and 548. The flange portion 540 itself may be bounded by two chamfers 546, 548, with a straight/flat surface 550 between. An inside corner radial geometry 542 may separate the bottom chamfer 544 from the first chamfer 546 bounding the flange 540. The transparent lens flange 540 thus has a stepped geometry. The machined step in the transparent material provides an increased bond surface area. The chamfers 544, 546, and 548 are applied to all sharp corners of the transparent material to remove microscopic edge cracks from the cutting process and assist with molding. A machined radial geometry at 542 can be advantageously employed on the inside corner to reduce stress concentrations caused by the otherwise abrupt geometry change that would occur if the corner were square.

With reference to FIG. 7B, the flange surface to be bonded with the plastic during molding can include a joint adhesive 1401. The adhesive is deposited by spraying, printing, or otherwise dispensing, on the flange 540, chamfers 544, 546, 548, inside corner radial geometry 542, and flange plane/flat surface 550 of the transparent lens. The adhesive improves the bond strength between the plastic and the transparent material. Additionally, ink 504, is optionally included on the back surface of the lens. The lens may include an oleophobic coating 523 on the exterior surface. This surface can be a nano coating applied to the front surface of the lens to lower the surface energy of the transparent material and resist deposition of oils on the transparent material surface. Such materials are commonly referred to as anti-smudge or anti-fingerprint coating. This coating will prevent the joint adhesive 1401 from sticking to the front plane of the transparent material.

The flange 540 is disclosed as having three generally parallel planes. The rear plane 522 is the back surface of the transparent material on which the ink 504 decoration is printed and to which a display 1200 is laminated. The rear plane 522 has, in the past, had plastic bonded to glass around the entire perimeter of the lens. Various embodiments do not bond plastic to this plane of transparent material along the sides of the display, thus permitting a narrowing of the device width necessary to accommodate the display and enhancing the edge-to-edge display experience for the user. The intermediate plane 524 of the transparent material, which may be located at approximately the center of the lens thickness half way between the front and rear surfaces, serves to improve the mechanical bond between plastic and transparent material on the sides of the part without the need for plastic extending over the rear plane of the transparent material. The front plane 526 of transparent material is exposed to the user on the finished product and this surface does not have any plastic molded onto it. The display is viewed through this front surface of the transparent lens.

The lens housing 800 (illustrated in FIGS. 8-10) of lens housing with laminated display 102, includes the transparent lens 500 integrally molded with the lens housing side wall 902. The lens 500 is insert molded with the lens perimeter plastic to create the desired geometry for the front lens housing, including a plastic rim integrally bonded to the transparent lens.

With reference to FIG. 10, in the molding process, the transparent lens 500 is inserted prior to molding the plastic portion 900 that includes the plastic side wall 902, and is integrally bonded after the plastic resin is added and cured. When the molding process is completed, the flange 540 geometry facilitates the plastic 902 forming smoothly tangential to both the front 526 and rear 522 planes of the transparent lens 500. Although tangential could mean coplanar if both surfaces are flat, it also means "continuous" if the surfaces are curved, such that the surface is smooth at a location at which they meet. The plastic housing fills in the chamfer geometry 544, 546, 548, as well as the inner corner radial geometry 542, to create flush, consistent surfaces across the transitions from the transparent lens 500 to the plastic side walls 902. No gaps are visible to a user, who will see at most a finely defined single line where transparent material 500 to plastic 902 transition occurs. A plastic feature 960 created in the process is described in more detail below.

FIG. 11 is a flowchart that illustrates the basic procedures in the assembly, according to an embodiment. The transparent lens 500 is initially created S100, and (optionally) an oleophobic coating is applied to the lens S110. Adhesive is applied to the edge of the transparent lens S120. Then, plastic is injected onto the lens perimeter S130 (illustrated in more detail in FIGS. 12A-12E). Optically clear light-curable resin 1403 is applied to the lens rear surface 522 S140, and the display module 1200 is placed on the resin 1403. Front 4000 and rear 4010 optical sources are then used to cure the resin S160 (see FIGS. 42 and 43).

FIGS. 12A-12E illustrate this assembly process. In FIG. 12A an injection molding tool (injection mold) 1100 comprises a top portion 1102 and a bottom portion 1110. The top portion 1102 has the transparent lens 500 placed in it. The bottom portion of the mold 1110 is brought into contact with the top portion 1102, as shown in FIG. 12B, and then, as shown in FIG. 12C, the plastic portion 900 is injected into the mold 1100. When the mold 1100 is separated, the integrated transparent lens 500 and plastic portion 900 is formed. FIG. 12E is an exploded view of the mold portions 1102, 1110 and the transparent material/plastic 500, 900 assembly. The holes 108, 110 may be utilized so that the transparent lens 500 can be accurately located in an injection molding tool 1100.

With reference to FIGS. 13-14, the display module 1200 includes a rear glass (glass for the display, as defined herein, can also include other types of transparent material, such as plastic, etc. of sufficient strength and durability) 1205, a front glass 1201, and a polarizer 1203. A display 1200 is laminated to an inside surface of the front lens housing 800 using liquid Optically Clear Resin (OCR) 1403. The OCR 1403 is dispensed on the lens 500 or display 1200, and the lens and display are then bonded together. The OCR 1403 flows out from the viewing area and up the sides of this display module 1403a to form a soft OCR cushion. The adhesive cushion 1403 is thus formed using overflow from the lamination process. The liquid adhesive 1403 permanently laminates the display module to the front lens. As illustrated, the polarizer 1203 and the front glass 1201 contact the optically clear resin (OCR) 1403. The display active pixel perimeter is illustrated by line 1202. The molding process employed permits the display 1200 to be located in very close proximity to the side wall 902, and thus permitting the active pixels to be positioned very close to the outer edge. Additionally, the flanged edge structure 540 is particularly advantageous for accommodating the curved outer surface of the front lens housing with minimal spacing between the side wall 902 and the active pixels of the display.

FIG. 14 includes two embodiments. A first includes no ink 504 on the rear surface 522 of the transparent lens 500. When this is the case, the front surface boundary defining a front housing plastic-transparent material transition 530' may extend further than an embodiment where the ink 504 is present and where the front surface boundary defines a front housing plastic-transparent material transition 530 that is closer to the device edge. The ink 504 can be applied to the rear surface 522 of the lens 500 along the side walls, such that the ink will frame the entire window 104 (FIG. 1). By not including ink along the side walls, the housing frames the viewing window 104, the edge-to-edge appearance is maintained, the cost of applying ink is not incurred, and application of UV light through the front lens has better access to the OCR 1403 for curing during the assembly process (described in more detail below).

With reference to FIG. 15, prior art molding includes a side wall 902 and transparent lens 500. In order to make the bond surface larger, a large plastic arm 1506 extends out into the transparent material surface. The arm 1506 creates a large surface area that blocks the viewing area of the display, and increases the size of the bezel around the display. As a consequence, the size of the housing for a given display must be larger in the prior art than is possible in the flange embodiment described herein.

FIGS. 16 and 17 illustrate further limitations of the prior art. The flat lens 500 and display laminate 1200 uses opaque ink 504, and the area behind the lens that accommodates the plastic arm 1506 required for molding can be seen to be quite large. The active pixels are moved further in, creating a greater gap between the active pixels and the outer perimeter of the device, than can be achieved with the construction described herein. Unlike the present disclosure, the outer edge of the lens in the prior art extends past the edge of the display module, thus increasing the width of the device.

FIGS. 18-20 illustrate the display and front housing section laminate 102. The back of the display includes display circuitry 2104 (FIG. 21) which is shown in FIG. 18. FIG. 19 shows the side cross-sectional view illustrating an expanded full view of the lens and display laminate 102. As can be seen from FIG. 20, along the top of the device 100, the display 1200 extends to the plastic housing 902 along the top wall. The bottom of the display shows a gap 2002 which is a tolerance of the display within the housing. Alternatively, the OCR may overflow and be cured 1403a. The gap may or may not get filled when the OCR 1403 overflows.

With reference to FIGS. 21 and 22, expanded cross sectional views of the lens housing and display laminate 102 and mesh and gasket assembly 2105 is illustrated. The front housing display assembly includes display driver circuits 2104. A first embodiment is illustrated in FIG. 21. The display 1200 includes rear glass 1205, front glass 1201, and polarizer 1203. The rear display glass 1205 in the embodiment of FIG. 21 extends past the front display glass 1201 towards the device edge, and forms a fragile cantilever 1234 over the air gap 1405.

Although a display includes other components and layers not specifically described herein for brevity, the illustrated display includes circuits 2104 which contains a display driver. A flex 2102 provides electrical connection between components of circuit 2104 and the PCB 306. The display 1200 can be any conventional display, and may for example be a liquid crystal display, a light emitting diode display, an organic light emitting display, an AMOLED, or any other conventional display.

When manufactured, as illustrated in FIG. 21, the OCR 1403 flows between the lens 500 and the display front glass 1201 or polarizer 1203, forming a laminate by the permanent bond between the display and the front lens. The liquid adhesive 1403 is shown stopping at the edge of the front glass 1201. However since it is liquid, and the flow may be uncontrolled, the OCR 1403 can potentially flow into and through the air gap 1405 or stop short of the edge of the front glass 1201. The air gap 1405 exists between the front lens 500 and the glass display edge including circuit 2104. Any liquid overflow into the air gap can potentially interfere with the positioning of the speaker mesh and gasket 2105 in this embodiment. Additionally, as can be seen in FIG. 21, there is no physical guide to prevent mesh 2108 and gasket 2106 from being incorrectly positioned, such as being positioned too low on the transparent lens (e.g., positioned offset from speaker opening 108, or too far away from the device edge). The display cushioning pad 1255 is also shown.

With reference to FIG. 22A, an alternate embodiment includes a structure 2202 molded into the lens housing 102. The structure 2202 is integrally molded with the wall 902 and also along the back surface 522 of the transparent lens 500 (shown in FIG. 22A) as part of the molding process when the lens housing is manufactured. The integrally molded structure is particularly advantageous. It permits the speaker mesh and gasket 2105 to be placed accurately in the lens housing 102 during assembly of the device 100.

It also provides an integral dam, minimizing a flow of liquid adhesive 1403, and thus minimizing the liquid flow onto the area for mesh and gasket assembly 2105. Contact between the liquid adhesive 1403 and the mesh and gasket assembly 2015 can be minimized while still allowing some liquid adhesive to fill the small gap because larger gaps may be deliberately introduced in other locations, and thus the flow of the liquid 1403 is less restricted where the larger gaps exist. The bulk of the overflow will pool in the larger gap areas while a small amount partially fills the small gap in cross section before meeting resistance.

The lens housing provides a seat for the mesh and gasket assembly 2105, such that it can be reliably located in the lens housing without interference from the adhesive. The speaker opening 108 mesh and gasket assembly 2105 can thus be accurately positioned prior to display lamination—allowing it to reside underneath the glass cantilever, if desired.

It is envisioned that the lens housing detail 2202 created during the molding process may follow the footprint of the display flex 2102 so that it supports the ledge but never contacts glass of the display 1200, but only the flex 2102. However, direct support of the rear glass 1205 is also possible and would offer similar advantages for reducing the cantilever condition found in the unsupported glass ledge of FIG. 21.

The housing support may also advantageously include a chamfered edge 2212 (see also FIG. 22B) shaped such that liquid adhesive that is used to laminate the display and lens will flow into and fill any small gap between the housing and the display ledge. The flex lead 2102 is thus well supported and protected if device 100 is exposed to mechanical shock.

FIG. 23 shows the lens assembly and mesh gasket assembly 2105 for the speaker port according to FIG. 21, without the support structure. FIG. 24 shows the lens housing including the support structure 2202 according to FIG. 22A, but not including the mesh gasket assembly 2105 for the speaker port. FIG. 25 shows the lens housing with the mesh and gasket assembly 2105 inserted. The mesh and gasket assembly 2105 may be positioned in the lens housing prior to display lamination, allowing the mesh to be well positioned underneath the display. The added structure 2202 prevents liquid adhesive from interfering with the speaker mesh and gasket 2105, preventing it from adhering to the rear of the lens or inadvertently sealing the audio port 108. In FIG. 23, nothing prevents misassembly of the mesh gasket assembly towards the bottom of the lens housing. This can lead to cosmetic problems visible through the acoustic port 108 or blockage of the acoustic port. The structure 2202 present in FIGS. 24 and 25 prevents misassembly of the mesh gasket assembly by providing a bottom edge against which to place the assembly.

The structure 2202 provides a precision height support for the display 1200 when the display is positioned into the front lens housing during assembly. The structure 2202 height can be controlled during molding, to provide the appropriate seat for the display and display flex 2102 bonded to the rear display glass 1200. As described above, the assembly may include a cushioning pad 1255 adhered to the rear of the display for protection from other parts of the device. The display driver 2104 is an integrated circuit attached to the rear display glass as shown in the FIGS. 21 and 22. Liquid adhesive 1403 may fill the area around the display driver and bond the lens 500, the housing 902, and flex 2102, and/or the rear display glass 1200. The lens housing preferably contains support structure 2202 to prevent bending of the glass cantilever and contain the liquid adhesive 1403.

FIGS. 26-28 illustrate the lens housing with laminated display 102. The walls 902 can provide plastic features to accurately align a display module 1200 to the viewing window from the side. Additionally, edges 2802 can be provided to align the display on the lens housing 102.

With reference to FIGS. 29-44, the housing assembly will now be described. The illustrated lens housing with laminated display 102 includes dovetail protrusions 940 along the side walls of lens housing walls 902. The dovetail protrusions each include a snap hole 946 and a pin hole 942 (best seen in FIG. 32). The dovetail protrusions also contain angled faces 940a at each end of the protrusion. These angled faces 940a provide a significant advantage in that they prevent the plastic sidewall 902 from being able to rotate about the plastic-to-transparent lens bond.

The internal chassis 304 includes mating dovetail cuts 3302 (best viewed in FIG. 33) for each of the dovetail protrusions 942 in the lens housing assembly. These dovetail cuts include matching angled faces 3302a at each end of the cut to interface with the angled faces 940a of the dovetail protrusions 940. To assemble, the dovetail protrusions 940 are slid into the dovetail cut 3302. The dovetail protrusions slide into the dovetail cuts in the internal chassis. The matching angled faces 940a, 3302a prevent the side walls 902 of the lens housing 800 from being able to move along the axis of the pin hole, thus preventing any torque from being exerted on the glue bond 1401 between the plastic housing flange 960 and transparent lens flange 540. When assembled, the pin hole 942 in the dovetail protrusion aligns with pinhole 3303 in the dovetail cut 3302 of the internal chassis assembly 304. The cylindrical pin 311 is inserted into the axially aligned pin holes. The pins hold the chassis on the front lens housing during assembly. The cylindrical pin may include a retention feature 311a (FIG. 35) or have a smooth bore as shown in FIG. 36.

FIGS. 29-41 illustrate the assembly of lens housing with laminated display 102 to the internal chassis 304, and the final assembly of the device housing. The pins 311, 311' are inserted into the pinholes when the pinholes are aligned as noted above. The pins 311 including retention features 311a to snap or press into the pinholes. The smooth bore pin 311' is held by friction fit. Friction will be exerted on the pin 311' when inserted into the pin holes due to the layers of glass, the liquid adhesive 1403, and the optional compressed pad 1255 (best seen in FIGS. 39 and 41), causing the chassis to push out against the pin 311' and hold it in place during assembly. The vertical stack includes the PCB 306 assembly having shields 3902 positioned against the rear glass 1205 and the battery 312.

The rear housing includes a composite insert 200 with integrally molded plastic side walls 220. The side walls include snap fingers 222 (FIGS. 40, 41) which engage the snap holes 946 in the lens housing dovetail feature 940 to hold the rear housing on the lens housing with laminated display assembly 102. Once assembled, the rear housing side walls 220 cover the pins 311, 311' and further prevent them from sliding out along the axis of original insertion as illustrated in FIGS. 38 and 39. The rear composite insert 200 is formed to the intended three-dimensional shape for the rear housing. The rear housing holds the battery against the PCB assembly and the display module in the stack up. Additionally, adhesive (not shown) could be included between the rear housing and the battery and or the chassis to secure the stack.

Display Lamination onto a Transparent Insert Molded Lens

The liquid optically clear resin (OCR) 1403 is dispensed between the lens 500 and the display assembly 1200 to bond the display to the front lens. The OCR 1403 flows out from the viewing area and up the side walls 902 between the display and the perimeter wall 902 of the lens assembly. This OCR 1403 forms a soft "cushion". The adhesive cushion 1403 is thus formed using overflow from the lamination process. The liquid adhesive 1403 permanently laminates the display module 1200 to the lens 500. The display in the illustrated example includes an integrated touch screen sensor.

In a traditional display lamination (FIGS. 16 and 17) to flat transparent lens, lamination takes place to stand-alone glass without any plastic feature. As a result, the edge of the display module is exposed and may be damaged throughout additional manufacturing steps. Liquid adhesive may overflow past the edges of the display, but will not be positioned to protect the side of the display consistently as various embodiments described herein do.

In the prior art, the transparent lens 500 extends past the edge of the display 1200 to provide a landing area for excess adhesive to flow during lamination. This extended lens shown in FIGS. 16 and 17 increases device size, whereas the flange 540 construction of the lens assembly housing 800 described herein avoids the extra width in the present flange construction for both transparent material and plastic. In the preferred embodiment, the transparent lens 500 is actually narrower than the display module 1200. FIG. 14 shows that to achieve this, the plastic side wall 902 forms a planar continuation 922 of the rear surface of the transparent material 522 resulting in a single, planar display lamination surface created partially by transparent material and partially by plastic in the lens housing 800.

An additional benefit may be realized by adhesive overflow 1403a to coat the sides of the display module as shown in FIGS. 11 and 13. Since the more traditional display lamination of FIGS. 16 and 17 occurs between two flat glass planes of the lens and display, there are no mechanical features to properly locate the display to the viewing window of the lens. Proper locating requires specialized and costly optical vision systems to align the viewing window of the lens to the active area of the display. The walls 902 of the lens housing 800 can provide a guide for positioning the display 1200 without use of specialized equipment.

Traditional display lamination to a flat transparent lens uses liquid adhesive which is cured using ultraviolet light shined through the viewing window of the lens. A side ultraviolet light is then employed to cure the liquid adhesive that the front UV light cannot reach, specifically the areas where the front light sources are blocked by the opaque ink 504 on the lens 500.

In the present embodiment, the plastic side wall 902 prevents the use of a side ultraviolet light for curing the OCR 1403. FIGS. 42 and 43 show two alternate ultraviolet light techniques that can be used to cure the OCR 1403 and permanently bond the display 1200 and transparent lens 500.

As shown in FIG. 42, the display polarizer 1203 (or possibly some other opaque member of the display 1200) blocks light from the back of the device, and the opaque ink 504 blocks ultraviolet light from the front of the device, such that a portion of the OCR 1403 behind the ink 504 will not receive UV light for curing. According to the embodiment of FIG. 43, the opaque ink 504 is omitted from the rear surface 522 along the sides of the transparent lens, and the housing defines the viewing window 104 along the side walls.

A rear ultraviolet light source 4010 may be used to cure the liquid OCR 1403. The UV light can pass through the front 1201 and rear 1205 display glass in areas where electronic circuitry is not present. The front ultraviolet light source 4000 is used through the clear transparent lens 500 of the window 104. The OCR 1403 will cure (harden) where direct exposure to ultraviolet light occurs. By using the flange plastic feature 960 to define the viewing along the side walls 902, the need for opaque ink 504 printed on the rear surface 522 of the transparent lens 500 is avoided on the side walls. UV light is allowed to fully cure the liquid adhesive 1403 from the front, and the overflow 1403a is cured by UV light from the rear.

Finally, once the display lamination is complete, the edges of the display are inherently protected by the molded plastic sidewalls 902 of the transparent lens insert 500 molded plastic throughout the rest of manufacturing unlike traditional fabrication methods which leave the fragile glass display 1200 edges substantially exposed throughout shipping and until further manufacturing steps are completed.

The disclosed device 100 has several additional advantages over existing structures. Side screws are avoided, the screw diameter increasing device thickness and the head thickness increasing device width. Snaps used alone loosen over time, provide limited directional constraints, and can disengage upon mechanical shock. Heat stakes provide poor serviceability, require clearance for heat steak heads, and use special equipment. Glue alone offers poor serviceability and complex process controls.

The benefits, advantages, solutions to problems, and any element(s) that may cause any benefit, advantage, or solution to occur or become more pronounced are not to be construed as critical, required, or essential features or elements of any or all the claims.

| TABLE OF REFERENCE NUMERALS | |
|---|---|
| 100 | electronic display device |
| 200 | rear housing |
| 500 | transparent lens/glass or transparent material |

-continued

TABLE OF REFERENCE NUMERALS

|  |  |  |
|---|---|---|
|  |  | portion of housing (see below) |
|  | 900 | plastic (portion of) housing (see below) |
|  | 1200 | display module/display (see below) |
| 100 |  | electronic display device (101-299 misc. external components) |
|  | 102 | laminated display (housing 800 + display 1200) |
|  | 104 | display window |
|  | 108 | speaker port |
|  | 110 | microphone port |
|  | 112 | forward facing camera |
|  | 114 | electrical connector port |
|  | 150 | device width center line |
| 200 |  | rear housing/third housing component |
|  | 202 | rear microphone port |
|  | 204 | rear speaker port |
|  | 206 | rear facing camera |
|  | 210 | removable card access door |
|  | 220 | integrally molded side walls |
|  | 222 | finger |
|  |  | (301-499 misc. internal components) |
|  | 304 | internal chassis assembly/second housing component/structural housing |
|  | 306 | printed circuit board (PCB) |
|  | 308 | top antenna housing |
|  | 309 | fasteners/screws |
|  | 310 | bottom antenna housing |
|  | 311, 311' | pins |
|  | 311a | retention feature |
|  | 311b | end of pin distal to camera center |
|  | 311c | head of pin |
|  | 312 | battery |
|  | 320 | card tray |
|  | 322 | card bay |
|  | 402 | stiffener |
|  | 404 | screws |
|  | 406 | card access slot |
| 500 |  | transparent lens/glass transparent material portion of housing |
|  | 504 | opaque ink |
|  | 510 | perimeter edge |
|  | 522 | rear surface |
|  | 523 | oleophobic coating |
|  | 524 | intermediate plane |
|  | 526 | front surface |
|  | 530 | front surface boundary (inked lens); house plastic-transparent material front surface transition |
|  | 530' | front surface boundary (non-inked lens); house plastic-transparent material front surface transition |
|  | 532 | rear surface boundary; house plastic-transparent material rear surface transition |
|  | 540 | flange/stepped flange |
|  | 542 | inside corner radial geometry |
|  | 544, 546, 548 | chamfers |
|  | 550 | straight/flat surface; flange plane |
| 800 |  | lens assembly housing (without the display) |
| 900 |  | plastic (portion of) lens assembly housing/plastic housing/first housing component/cosmetic housing |
|  | 902 | plastic side wall |
|  | 904 | plastic side wall inner surface |
|  | 922 | rear surface portion |
|  | 926 | front surface portion |
|  | 930 | housing seat |
|  | 940 | dovetail protrusions |
|  | 940a | angled portions of dovetail protrusions |
|  | 942 | first pin hole |
|  | 946 | snap hole |
|  | 948 | first pin hole surface distal from an end (311b) of the pin (311) distal to a camera center |
|  | 950 | snap hole countersink |
|  | 960 | (flange) plastic feature |
|  | 962 | front surface |
|  | 964 | rear surface |
| 1100 |  | injection molding tool/injection mold |
| 1102 |  | injection mold top portion |
| 1110 |  | injection mold bottom portion |

-continued

TABLE OF REFERENCE NUMERALS

|  |  |  |
|---|---|---|
| 1200 |  | display module/display |
|  | 1201 | front glass (pane) |
|  | 1202, | active pixel perimeter boundary |
|  | 1202' | active pixel perimeter boundary projected onto transparent lens |
|  | 1203 | polarizer |
|  | 1205 | rear glass (pane) |
|  | 1230 | end |
|  | 1232 | glass display edge/rear glass end |
|  | 1233 | front glass end |
|  | 1234 | rear glass section that is longer than the front glass/cantilever |
|  | 1239 | closest point of front transparent pane to mesh and gasket assembly |
|  | 1255 | display cushioning pad/compressible pad |
| Other |  |  |
|  | 1401 | joint adhesive |
|  | 1403 | display adhesive/optically clear resin (OCR) |
|  | 1403a | excess display adhesive |
|  | 1405 | air gap |
|  | 1506 | large plastic arm |
|  | 2002 | gap |
|  | 2102 | flexible printed circuit |
|  | 2103 | location of flexible printed circuit bond to rear glass |
|  | 2104 | display driver integrated circuits (ICs) |
|  | 2105 | mesh and gasket assembly |
|  | 2106 | gasket |
|  | 2108 | mesh |
|  | 2110 | first edge of mesh and gasket assembly |
|  | 2112 | second edge of mesh and gasket assembly |
|  | 2122 | closest point of mesh and gasket assembly to the front pane of glass |
|  | 2202 | support structure |
|  | 2212 | chamfered edge of support structure |
|  | 2802 | display alignment edges |
|  | 3302 | dovetail cut/recess |
|  | 3302a | angled portions |
|  | 3303 | second pin hole |
|  | 3902 | shield |
|  | 4000 | front optical source |
|  | 4010 | rear optical source |
|  | S100-S170 | method steps |

We claim:

1. A method of making a device housing, the method comprising:
   providing a transparent lens with a front surface and a rear surface, and a stepped flange along at least a portion of the lens perimeter;
   applying an oleophobic coating to the front surface of the transparent lens;
   injecting plastic onto the transparent lens perimeter, including the stepped flange, the plastic forming a plastic feature that has a front surface that is tangent to the front surface of the transparent lens, a rear surface that is tangent to the rear surface of the transparent lens, and that extends outward from the sides of the transparent lens away from a device width center line;
   applying optically clear light curable resin on the rear surface of the transparent lens;
   placing a display module on the resin; and
   optically curing the resin with at least one optical source;
wherein:
   a first boundary between the front surface of the transparent lens and the plastic feature is closer to a center line of the transparent lens than a second boundary between a back surface of the transparent lens and the plastic feature,
   the plastic feature is molded to the rear surface of the transparent lens at at least one of two ends of the device housing; and the plastic encapsulates a stepped middle surface of the transparent lens flange.

2. A method of making a device housing, the method comprising:
providing a transparent lens with a front surface and a rear surface, and a stepped flange along at least a portion of the lens perimeter;
injecting plastic onto the transparent lens perimeter, including the stepped flange, the plastic forming a plastic feature that has a front surface that is tangent to the front surface of the transparent lens, a rear surface that is tangent to the rear surface of the transparent lens, and that extends outward from the sides of the transparent lens away from a device width center line; and
applying an oleophobic coating to the front surface of the transparent lens,
wherein:
the plastic feature is molded to the rear surface of the transparent lens at at least one of two ends of the device housing; and
the plastic encapsulates a stepped middle surface of the transparent lens flange.

3. The method as defined in claim 1, further comprising, prior to injecting the plastic, applying an adhesive to the flange edges of the transparent lens.

4. The method as defined in claim 3, the oleophobic coating preventing the adhesive from sticking to the front surface of the transparent lens.

5. The method as defined in claim 1, wherein a decorative ink on the transparent lens rear surface defines a viewing area of at least one edge of the display.

6. The method of claim 5, further comprising:
applying optically clear light curable resin on the transparent lens rear surface;
placing a display module on the resin; and
optically curing all of the resin using only a front optical source and a rear optical source.

7. The method as defined in claim 1, wherein a housing plastic to transparent lens material front surface transition line defines a viewing area of at least one edge of the display.

8. The method of claim 7, wherein the front surface transition line is closer to a device width center line than a rear surface boundary of the plastic and transparent lens.

9. A method of making a device housing:
creating a transparent lens with a front surface and a rear surface, and a stepped flange along at least a portion of the lens perimeter;
applying an oleophobic coating to the front surface of the transparent lens;
applying an adhesive to the flange edges of the transparent lens;
injecting plastic onto the transparent lens perimeter, including the stepped flange, the plastic forming a plastic feature that has a front surface that is tangent to the front surface of the transparent lens, a rear surface that is tangent to the rear surface of the transparent lens, and that extends outward from the sides of the transparent lens away from a device width center line;
defining a housing plastic-transparent lens material rear surface transition line as a viewing area of at least one edge of the display;
applying optically clear light curable resin on the transparent lens rear surface on both sides of the transition line;
placing a display module on the resin; and
optically curing all of the resin using only a front optical source and a rear optical source;
wherein:
the plastic feature is molded to the rear surface of the transparent lens at at least one of two ends of the device housing; and
the plastic encapsulates a stepped middle surface of the transparent lens flange;
the front surface boundary is closer to a device width center line than a rear surface boundary of the plastic and transparent lens.

\* \* \* \* \*